United States Patent
Tang et al.

(10) Patent No.: US 9,337,237 B2
(45) Date of Patent: May 10, 2016

(54) METHODS, STRUCTURES AND DEVICES FOR INCREASING MEMORY DENSITY

(71) Applicant: Micron Technology, Inc., Boise, ID (US)

(72) Inventors: Sanh D. Tang, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 408 days.

(21) Appl. No.: 13/897,615

(22) Filed: May 20, 2013

(65) Prior Publication Data

US 2013/0248800 A1    Sep. 26, 2013

Related U.S. Application Data

(63) Continuation of application No. 12/610,922, filed on Nov. 2, 2009, now Pat. No. 8,461,566.

(51) Int. Cl.
| | |
|---|---|
| *H01L 27/24* | (2006.01) |
| *H01L 21/22* | (2006.01) |
| *H01L 27/02* | (2006.01) |
| *H01L 45/00* | (2006.01) |

(52) U.S. Cl.
CPC ............ *H01L 27/2409* (2013.01); *H01L 21/22* (2013.01); *H01L 27/249* (2013.01); *H01L 27/2436* (2013.01); *H01L 27/0207* (2013.01); *H01L 45/04* (2013.01); *H01L 45/06* (2013.01); *H01L 45/1226* (2013.01); *H01L 45/144* (2013.01); *H01L 45/146* (2013.01)

(58) Field of Classification Search
CPC ............ H01L 27/2409; H01L 27/2436; H01L 27/249; H01L 21/22; H01L 45/06; H01L 45/1226; H01L 45/144; H01L 45/146; H01L 27/0207; H01L 45/04
See application file for complete search history.

(56) References Cited

U.S. PATENT DOCUMENTS

| | | | |
|---|---|---|---|
| 6,180,496 B1 | 1/2001 | Farrens et al. | |
| 6,303,468 B1 | 10/2001 | Aspar et al. | |
| 6,335,258 B1 | 1/2002 | Aspar et al. | |
| 6,525,953 B1 | 2/2003 | Johnson | |
| 6,567,295 B2 | 5/2003 | Taussig et al. | |

(Continued)

FOREIGN PATENT DOCUMENTS

| | | | |
|---|---|---|---|
| CN | 1505043 A | 6/2004 | |
| CN | 1963946 A | 5/2007 | |

(Continued)

OTHER PUBLICATIONS

International Search Report for International Application No. PCT/US2010/054564, mailed May 31, 2011, 3 pages.

(Continued)

*Primary Examiner* — William Coleman
(74) *Attorney, Agent, or Firm* — TraskBritt

(57) ABSTRACT

Non-volatile memory devices comprising a memory string including a plurality of vertically superimposed diodes. Each of the diodes may be arranged at different locations along a length of the electrode and may be spaced apart from adjacent diodes by a dielectric material. The electrode may electrically couple the diodes of the memory strings to one another and to another memory device, such as, a MOSFET device. Methods of forming the non-volatile memory devices as well as intermediate structures are also disclosed.

25 Claims, 34 Drawing Sheets

(56) References Cited

U.S. PATENT DOCUMENTS

| | | | |
|---|---|---|---|
| 6,631,085 | B2 | 10/2003 | Kleveland et al. |
| 6,756,286 | B1 | 6/2004 | Moriceau et al. |
| 6,809,044 | B1 | 10/2004 | Aspar et al. |
| 6,933,530 | B2 | 8/2005 | Toet et al. |
| 6,946,365 | B2 | 9/2005 | Aspar et al. |
| RE39,484 | E | 2/2007 | Bruel |
| 7,283,403 | B2 | 10/2007 | Johnson |
| 7,447,056 | B2 | 11/2008 | Scheuerlein et al. |
| 7,768,812 | B2 | 8/2010 | Liu |
| 7,986,545 | B2 | 7/2011 | Yoon et al. |
| 8,084,830 | B2 * | 12/2011 | Kanno ............... H01L 27/101 257/296 |
| 8,143,146 | B2 | 3/2012 | Kiyotoshi |
| 2004/0114428 | A1 | 6/2004 | Morikawa |
| 2006/0099776 | A1 | 5/2006 | Dupont |
| 2007/0103963 | A1 | 5/2007 | Kim et al. |
| 2008/0048237 | A1 | 2/2008 | Iwata |
| 2008/0067554 | A1 | 3/2008 | Jeong et al. |
| 2008/0175032 | A1 | 7/2008 | Tanaka et al. |
| 2008/0265235 | A1 | 10/2008 | Kamigaichi et al. |
| 2008/0280390 | A1 | 11/2008 | Kim et al. |
| 2008/0304308 | A1 | 12/2008 | Stipe |
| 2008/0316808 | A1 | 12/2008 | Herner et al. |
| 2009/0081824 | A1 | 3/2009 | Tripsas et al. |
| 2009/0085153 | A1 | 4/2009 | Maxwell et al. |
| 2009/0085154 | A1 | 4/2009 | Herner et al. |
| 2009/0230458 | A1 | 9/2009 | Ishiduki et al. |
| 2009/0267047 | A1 * | 10/2009 | Sasago ............... H01L 27/2409 257/4 |
| 2009/0294751 | A1 | 12/2009 | Kiyotoshi |
| 2010/0117047 | A1 | 5/2010 | Tanaka et al. |
| 2011/0101298 | A1 | 5/2011 | Tang et al. |

FOREIGN PATENT DOCUMENTS

| | | |
|---|---|---|
| TW | 571439 | 1/2004 |
| TW | I268604 | 12/2006 |
| TW | 200931433 | 7/2009 |

OTHER PUBLICATIONS

Written Opinion for International Application No. PCT/US2010/054564, mailed May 31, 2011, 4 pages.

International Preliminary Report on Patentability for International Application No. PCT/US2010/054564 dated May 8, 2012, 5 pages.

* cited by examiner

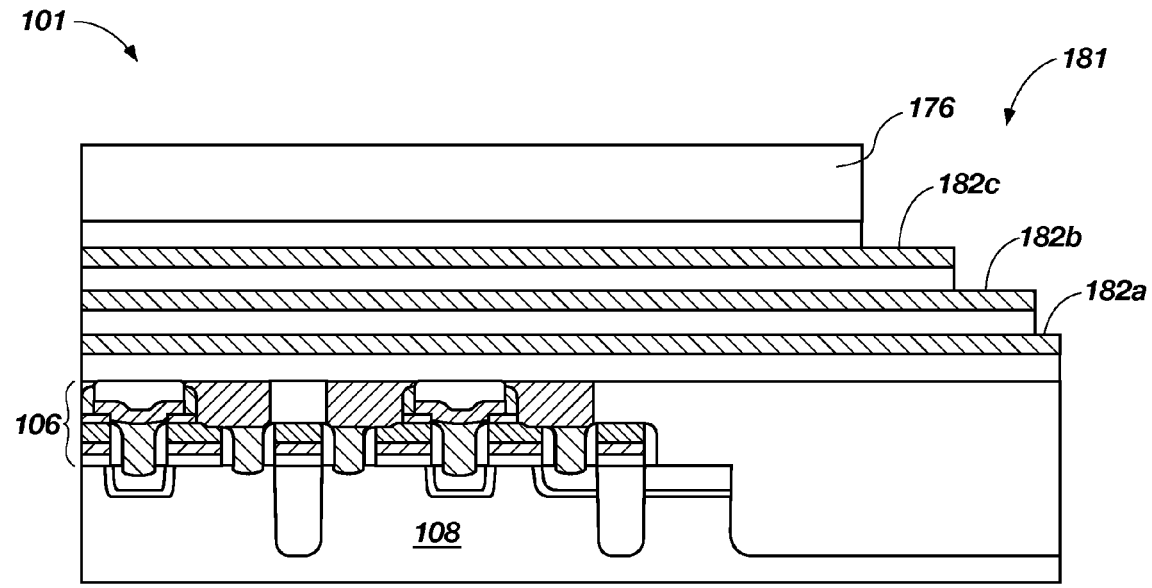
FIG. 9B
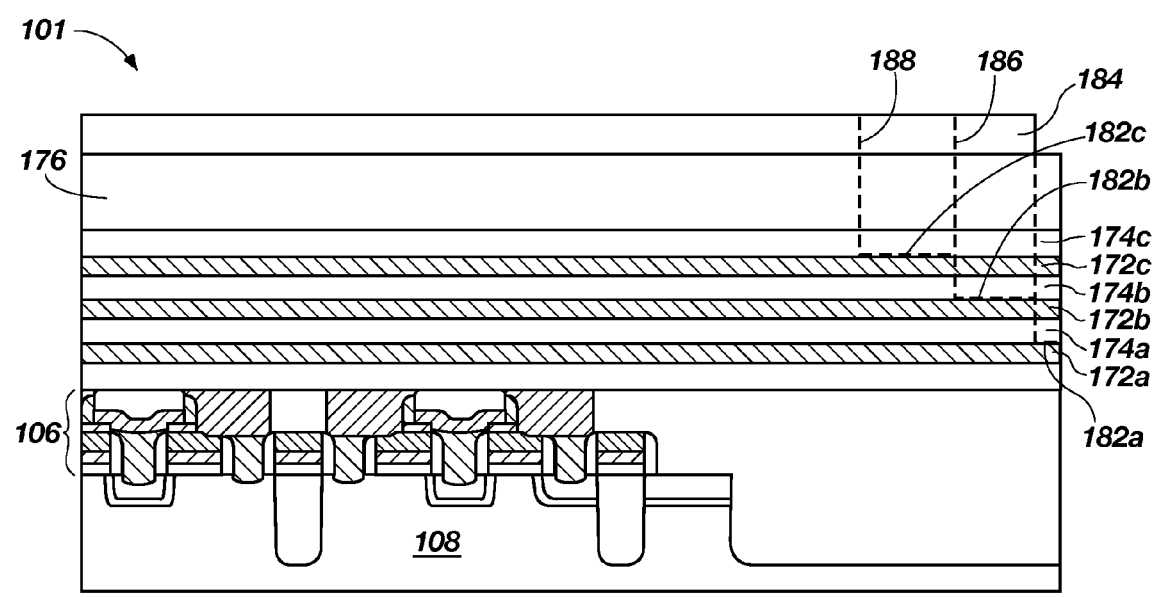
FIG. 9B1

FIG. 9B2

METHODS, STRUCTURES AND DEVICES FOR INCREASING MEMORY DENSITY

CROSS-REFERENCE TO RELATED APPLICATION

This application is a continuation of U.S. patent application Ser. No. 12/610,922, filed Nov. 2, 2009, now U.S. Pat. No. 8,461,566, issued Jun. 11, 2013, the disclosure of which is hereby incorporated herein in its entirety by this reference.

TECHNICAL FIELD

Embodiments of the present invention relate to methods, structures, and devices for increasing memory density and, more specifically, to methods for forming multi-layer semiconductor structures and resulting structures and devices incorporating such structures.

BACKGROUND

Non-volatile memory devices are used to store digital data for computer systems and other electronic devices. Non-volatile memory does not change state upon removal or failure of power applied thereto and, thus, retains stored data even for subsequent retrieval despite interruptions in power supply. Examples of non-volatile memory cells include magnetic random access memory (MRAM), ferroelectric random access memory (FRAM), phase-change random access memory (PCRAM), or resistance random access memory (RRAM).

Due to the ever-increasing demand for non-volatile memory, developers and manufacturers are constantly attempting to increase the density of non-volatile memory cells beyond the capability of current technologies. To reach high storage densities, manufacturers typically focus on scaling down semiconductor devices to submicron dimensions. However, conventional non-volatile memory cells utilize a significant amount of real estate on a semiconductor substrate and, thus, the density of non-volatile memory cells is limited.

There is a need for methods, structures and devices for increasing density and reliability in non-volatile memory devices.

DETAILED DESCRIPTION

Figure 1A:
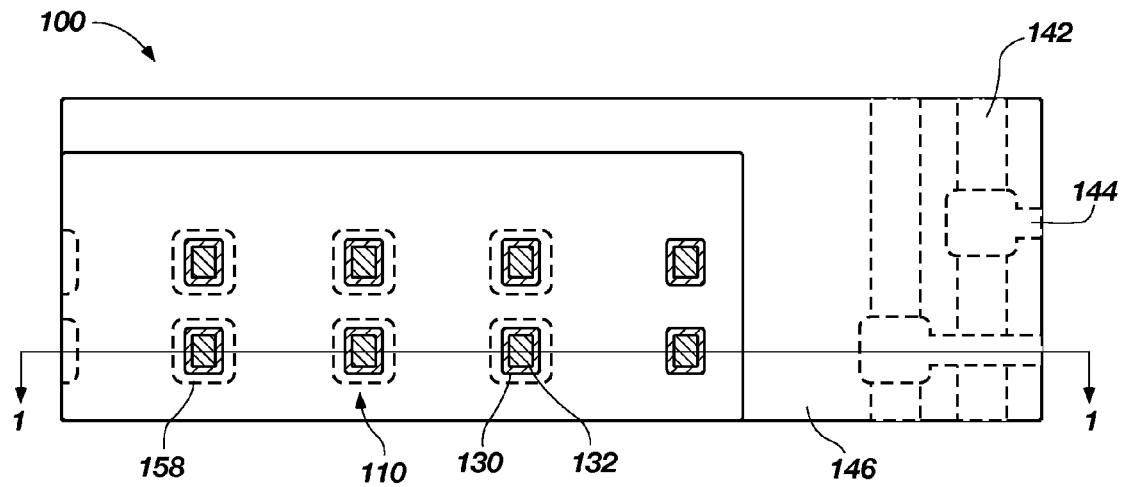
FIG. 1A is a top down view illustrating one embodiment of a memory device of the present invention.

The illustrations presented herein are not meant to be actual views of any particular device or system, but are merely idealized representations that are employed to describe the present invention. Additionally, elements common between figures may retain the same numerical designation. It will be appreciated that for simplicity and clarity of illustration, reference numerals for elements common between figures are not necessarily shown in each of the figures.

Figure 1B:
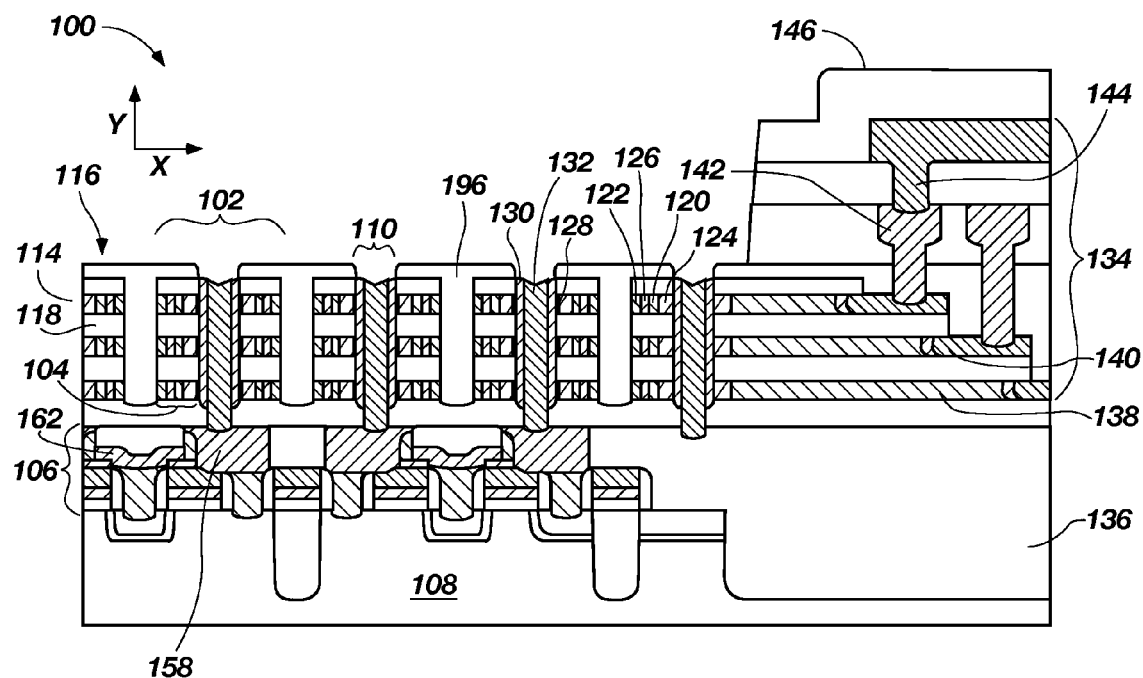
FIG. 1B is a partial cross-sectional view of the memory device shown in FIG. 1A taken along section line 1-1.

FIGS. 1A and 1B show an embodiment of a portion of memory device 100 of the present invention. FIG. 1B is a cross-sectional view of the memory device 100 shown in FIG. 1A, taken along section line 1-1 therein. The memory device 100 includes at least one memory string 102 in which a plurality of diodes 104 are electrically coupled to and spaced along a length of an electrode 110. The memory device 100 may be disposed on a conventional multi-gate memory device formed on a substrate 108, such as a conventional MOSFET array 106. As used herein, the term "substrate" means and includes a structure that includes semiconductor type material including, for example, silicon, germanium, gallium arsenide, indium phosphide, and other III-V or II-VI type semiconductor materials. Substrates include, for example, not only conventional substrates but also other bulk semiconductor substrates such as, by way of non-limiting example, silicon-on-insulator (SOI) type substrates, silicon-on-sapphire (SOS) type substrates, and epitaxial silicon supported by a base material. Semiconductor type materials may be doped or undoped. When reference is made to a "substrate" in the following description, previous process acts may have been utilized to at least partially form elements or components of an integrated circuit or device in or over a surface of the substrate 108.

The diodes 104 of each memory string 102 may be electrically coupled to one another and to the underlying MOSFET array 106 via the electrode 110. Active elements of the memory device 100 (i.e., elements through which charge carriers travel), or materials used to form such active elements, are cross-hatched to simplify the figures herein. Each memory string 102 may be isolated from an adjacent memory string 102 by dielectric studs 196. The dielectric studs 196 may include, for example, an oxide material or a nitride material. The diodes 104 may be arranged in a predetermined number of rows 114 and columns 116, the rows 114 and columns 116 being aligned in two, intersecting planes. In each of the columns 116, the diodes 104 may be vertically superimposed in a first direction, Y, substantially perpendicular to a major plane of the substrate 108. Each of the diodes 104 in the column 116 is separated from adjacent diode(s) 104 by an interlayer dielectric material 118. By way of non-limiting example, the interlayer dielectric material 118 may include an oxide material, such as, silicon dioxide. The diodes 104 within each of the rows 114 may be aligned with the diodes 104 of laterally adjacent rows 114 in a second direction, X, substantially parallel to the major plane of the substrate 108. Although the memory device 100 is shown with three (3) rows 114, any number, n, of rows 114 may be formed.

Each electrode 110 effectively forms a node at a point of contact between the diodes 104 of each of the memory strings 102. In some embodiments, a contact plug 132 may be electrically coupled to the underlying MOSFET array 106 via a cell plug 158 (shown in broken lines) to provide electrical communication between the diodes 104 of the memory string 102 and the MOSFET array 106, as will be described in further detail below.

The memory device 100 may include a contact structure 134 positioned above an isolation region 136 in the substrate 108. The contact structure 134 may provide electrical communication between the memory device 100 and conductive elements of a higher level substrate (not shown), such as a circuit board. The contact structure 134 may include semiconductive paths 138, contacts 140, line interconnects 142 and a metal line 144. Each of the semiconductive paths 138 extends between at least one of the electrodes 110 and one of the contacts 140 of the contact structure 134. Optionally, a first doped region 122 and a barrier material 128 may be disposed between each of the semiconductive paths 138 and the electrode 110. Each of the line interconnects 142 may extend between one of the contacts 140 and the metal line 144 to electrically couple each memory string 102 with the metal line 144. As shown in FIG. 1A, portions of the metal line 144 may be exposed through an optional passivation material 146.

Each of the diodes 104 may include an intrinsic region 120 disposed between the first doped region 122 and a second doped region 124, a silicide region 126 adjacent the first doped region 122 and the barrier material 128 adjacent the second doped region 124. The intrinsic region 120, the first doped region 122, the second doped region 124, the silicide region 126 and the barrier material 128 may extend in a direction perpendicular to a major plane of the substrate 108. The intrinsic region 120 may include a semiconductor material such as, for example, polysilicon, germanium, gallium arsenide or silicon germanium. Each of the first and second doped regions 122 and 124 may include polysilicon that is doped with an n-type dopant, such as phosphorous or arsenic, (i.e., p-type polysilicon) or a p-type dopant, such as boron or aluminum (i.e., n-type polysilicon). The first doped region 122 and the second doped region 124 may be oppositely doped. As used herein, the term "oppositely doped" means that one of the first and second doped regions 122 and 124 includes a surplus of negative charge carriers (n-type), while the other includes a surplus of positive charge carriers (p-type). For example, first doped region 122 (i.e., the doped region 122 adjacent the silicide region 126) may include p-type polysilicon while the second doped region 124 (i.e., the doped region 124 adjacent the barrier material 128) may include n-type polysilicon. The barrier material 128 may include, for example, a dielectric material, such as an oxide material or a nitride material. By way of non-limiting example, the silicide region 126 may be a non-transition metal silicide, such as cobalt silicide ($CoS_{i2}$), which is often referred to as "$CoS_{ix}$," titanium silicide ($TiS_{i2}$), tungsten silicide ($TiS_{i2}$) or nickel silicide ($NiS_{i2}$). The barrier material 128 may be in contact with the electrode 110. Diodes 104 on opposing sides of the electrode 110 may be mirror images of one another, wherein the intrinsic region 120, the first doped region 122, the second doped region 124, the silicide region 126 and the barrier material 128 are reversed in position relative to an axis electrode. Each of the electrodes 110 may include, for example, a sidewall spacer 130 and a contact plug 132. Each of the sidewall spacers 130 may be disposed over sidewalls of the interlayer dielectric material 118 and the barrier material 128.

Figure 2:
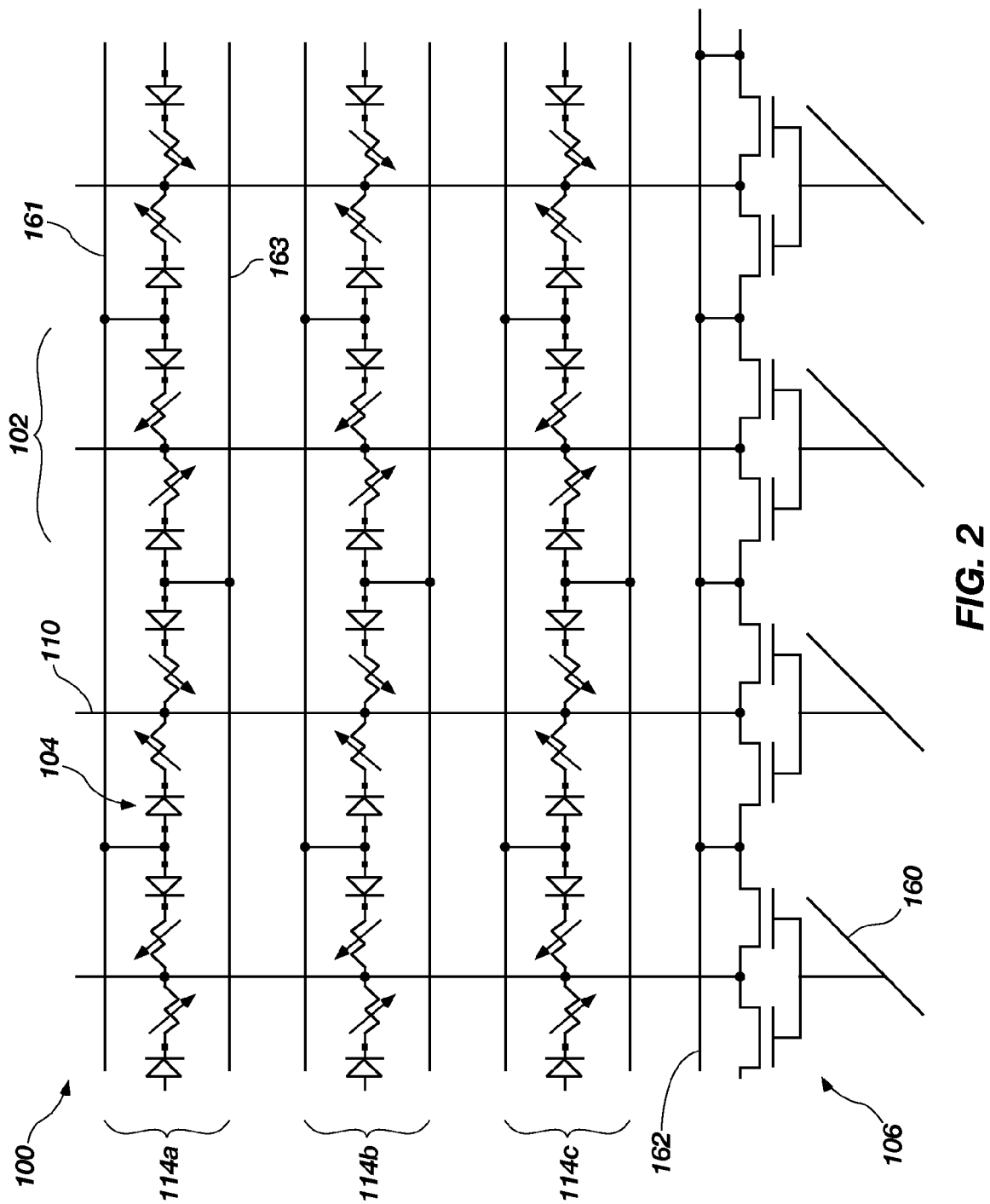
FIG. 2 is an electrical circuit diagram of the memory device of FIGS. 1A and 1B.

FIG. 2 is a circuit diagram illustrating the memory device 100 shown in FIGS. 1A and 1B. The memory device 100 includes the plurality of memory strings 102, each of the diodes 104 of which is electrically coupled to access lines, for example, a first word line 161 and a second word line 163. The first word line 161 and the second word line 163 may be electrically coupled to a data/sense line, for example, a bit line 162 and another access line, for example, another word line 160. The first word line 161 and the second word line 163 provide two distinct addresses for each of the memory strings 102 such that the memory device 100 may include, for example, two bits per node.

Figure 3A:
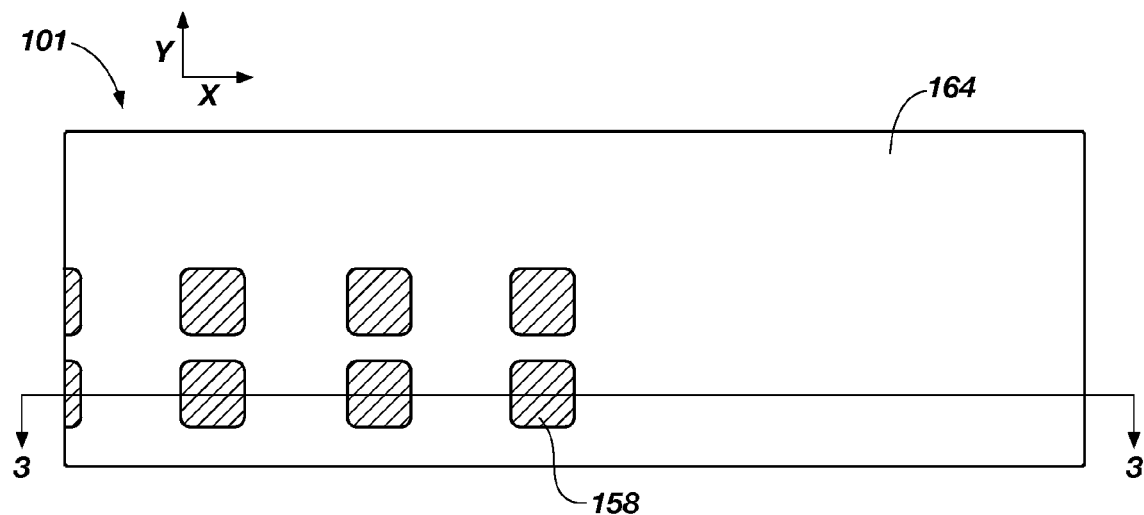
FIGS. 3A-32B are top down and cross-sectional views illustrating an embodiment of a method of the present invention used to form the memory device shown in FIGS. 1A and 1B.
Figure 3B:
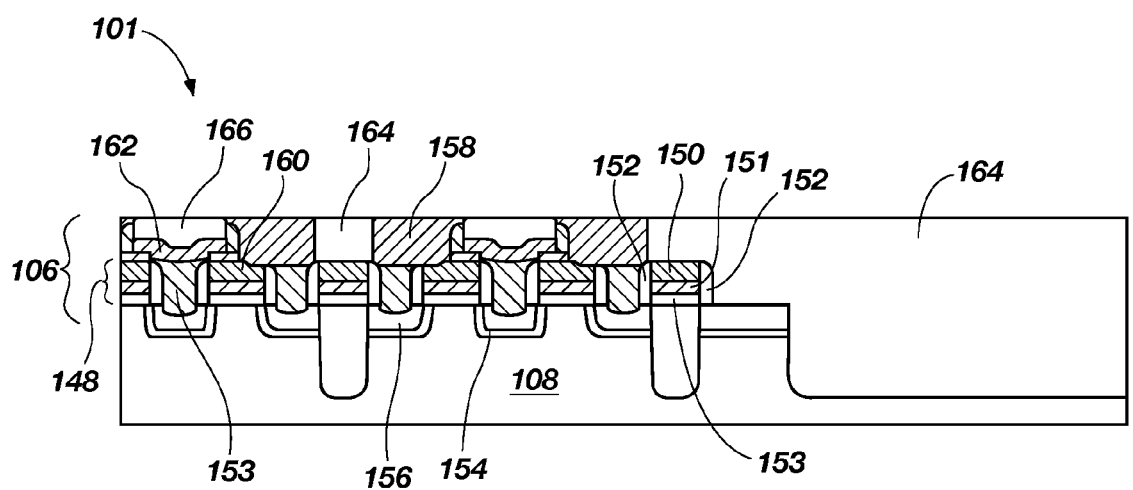

FIG. 3A is a top down view of a semiconductor structure 101 having the conventional MOSFET array 106 shown in FIGS. 1A and 1B formed on a substrate 108. To form the semiconductor structure 101, a plurality of cell plugs 158, an upper surface of which is exposed and positioned lateral to an electrically insulative material 164, may be aligned in the first direction Y and in the second direction X. FIG. 3B is a cross-sectional view of the semiconductor structure 101 shown in FIG. 3A taken along section line 3-3 therein. As shown in FIG. 3B, each of the cell plugs 158 is positioned laterally to the electrically insulative material 164 and nitride caps 166. The MOSFET array 106 may include a plurality of transistors, such as, MOSFET devices 148, each of which includes a gate region 150 overlying an oxide region 151 and a semiconductive material 153 and is positioned between insulative spacers 152. The MOSFET devices 148 are each disposed between a source region 154 and a drain region 156 in the substrate 108. Cell plugs 158 are disposed between the MOSFET devices 148. Each gate region 150 of the MOSFET devices 148 may be electrically coupled to the word line 160 while each source region 154 may be electrically coupled to the bit line 162 by the semiconductive material 153. The electrically insulative material 164, such as an oxide material, overlies portions of the gate regions 150 exposed through the cell plugs 158 and a surface of the substrate 108. Each bit line 162 is covered, for example, by a nitride cap 166. The MOSFET device 106 may be formed using conventional methods which are known in the art and, thus, are not described in detail herein.

Figure 4:
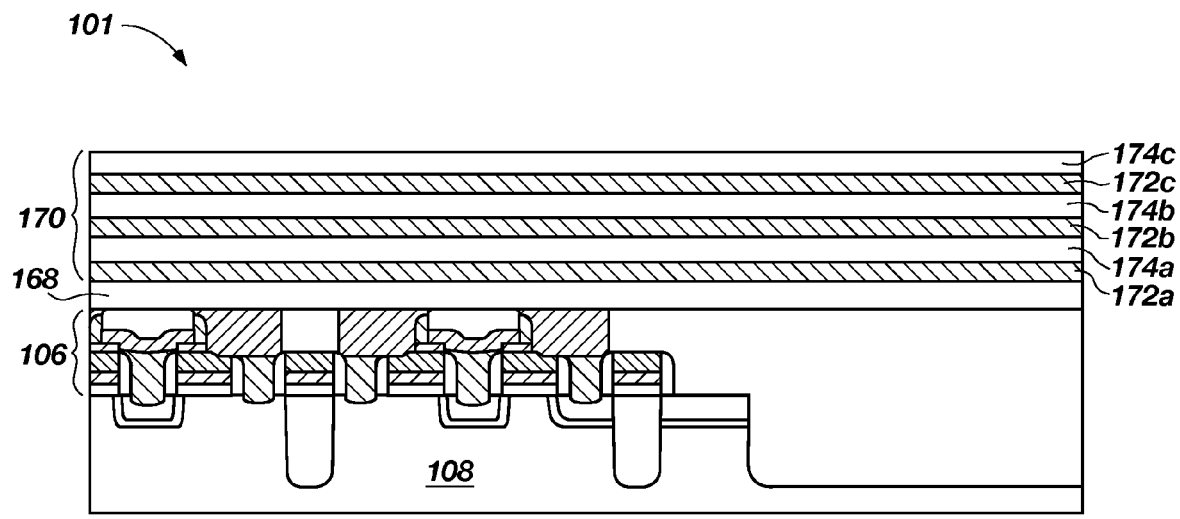

As shown in FIG. 4, a foundation material 168 may be formed over the MOSFET array 106. As a non-limiting example, the foundation material 168 may include a doped or undoped polysilicon material, or an oxide material. The foundation material 168 may be deposited using, for example, a conventional CVD process. A cell stack 170 including a plurality of alternating first regions 172a, 172b and 172c and second regions 174a, 174b, and 174c may be formed over the foundation material 168. The cell stack 170 shown in FIG. 4 includes three (3) first regions 172a, 172b and 172c and three (3) second regions 174a, 174b and 174c. However, the cell stack 170 may be formed to include any number of first regions 172a, 172b and 172c and second regions 174a, 174b and 174c based on a desired number of diodes 104 to be formed in each memory string 102. Each of the first regions 172a, 172b and 172c and second regions 174a, 174b and 174c of the cell stack 170 is formed from a material that may be selectively etched with respect to underlying materials. In some embodiments, the first regions 172a, 172b and 172c and second regions 174a, 174b and 174c may each be formed from a material that may be selectively etched with respect to overlying materials. By way of non-limiting example, each of the first regions 172a, 172b and 172c of the cell stack 170 may be formed from a doped or undoped polysilicon material, germanium, gallium arsenide or silicon germanium and may have a thickness of from about 20 nm to about 40 nm. For example, the second regions 174a, 174b and 174c may be formed from a doped or undoped polysilcon material and the first regions 172a, 172b and 172c may be formed from a doped or undoped polysilicon material selectively etchable with respect to an underlying one of the second regions 174a, 174b, and 174c. As another non-limiting example, the second regions 174a, 174b and 174c may be formed from a semiconductive material, such as, a polysilicon material, and the first regions 172a, 172b and 172c may be formed from a dielectric material, such as, an oxide material. Each of the second regions 174a, 174b and 174c of the cell stack 170 may be formed from, for example, a doped or undoped polysilicon, an oxide material, a nitride material or an oxynitride material and may have a thickness of from about 20 nm to about 50 nm. In some embodiments, the first regions 172a, 172b and 172c and the second regions 174a, 174b, and 174c may be deposited over one another using a conventional chemical vapor deposition (CVD) process.

In another embodiment, the second regions 174a, 174b and 174c may be formed from an oxide material, and the first regions 172a, 172b and 172c may be formed from crystalline silicon. In such an embodiment, each of the first regions 172a, 172b and 172c formed from crystalline silicon may be placed on a dielectric material, such as the foundation material 168 or one of the second regions 174a, 174b, and 174c, by a process described herein using a modification of the so-called SMART CUT® technology. Such processes are described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. However, other processes suitable for manufacturing a semiconductor material on the surface of a logic device may also be used, if sufficiently low process temperatures are maintained. In conventional implementation of SMART CUT® technology, donor and acceptor wafers are bonded together using a high temperature anneal, on the order of about 100° C. to about 130° C. However, an additional plasma activation act may be integrated into a conventional SMART CUT® technology fabrication process to lower a required bonding temperature, as described in detail below.

Figure 5:
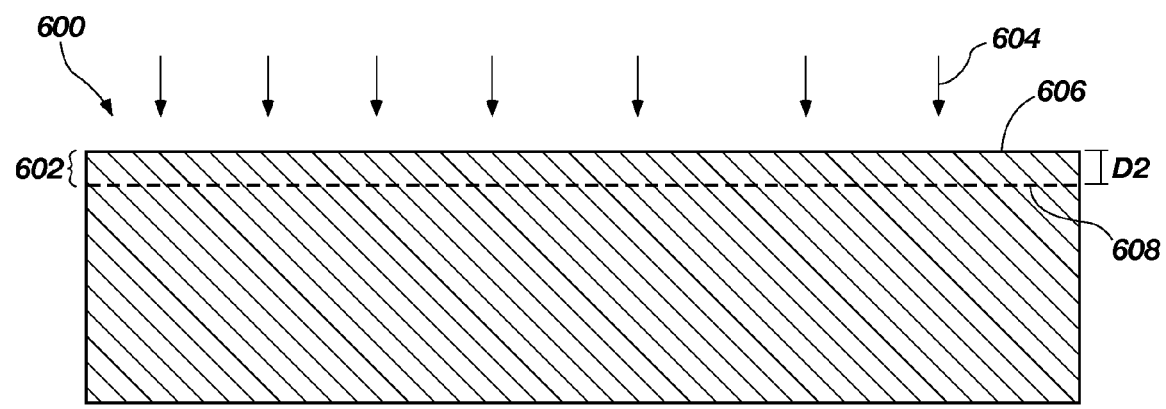

As shown in FIG. 5, a plurality of ions (e.g., hydrogen or inert gas ions) may be implanted into a donor wafer 600 formed from crystalline silicon to form an implanted region 602. As represented by directional arrows 604, an ion source (not shown) may be used to implant the plurality of ions into the donor wafer 600 in a direction substantially perpendicular to a major surface 606 of the donor wafer 600 to create the implanted region 602 which may also be characterized as a transfer region, an inner boundary 608 of which is shown in the donor wafer 600 in broken lines. As known in the art, the depth to which the ions are implanted is at least partially a function of the energy with which the ions are implanted into the donor wafer 600. Generally, ions implanted with less energy will be implanted at relatively shallow depths, while ions implanted with higher energy will be implanted at relatively deep depths. The inner boundary 608 of implanted region 602 lies substantially parallel to the major surface 606 of the donor wafer 600 and is at a predetermined depth which is dependent on selected parameters of the atomic species implant process, as is known to one of ordinary skill in the art. As a non-limiting example, ions may be implanted into the donor wafer 600 with an energy selected to form the inner boundary 608 at depth D2 of between about 20 nm and about 50 nm, and more particularly, about 30 nm.

The inner boundary 608 includes a layer of microbubbles or microcavities (not shown) including the implanted ion species, and provides a weakened structure within donor wafer 600. The donor wafer 600 may then be thermally treated at a temperature above that at which implantation is effected, in accordance with the disclosures of the patent documents in the preceding paragraph, to effect crystalline rearrangement in the wafer and coalescence of the microbubbles or microcavities.

An attachment surface (not shown) may be formed by exposing the major surface 606 of the donor wafer 600 to a reactive ion etching (RIE) plasma including an inert gas (e.g., argon, oxygen, or nitrogen) to form a plasma-activated material. The plasma-activated material increases the kinetics of a subsequent bonding act in the form of an oxide reaction with adjacent material of the foundation material 168 or one of the second regions 174a and 174b, due to the increased mobility of the ionic species (e.g., hydrogen) created on the major surface 606 thereof. By utilizing a plasma-activated material, the wafer bonding process may be performed at temperatures of less than about 400° C. One embodiment of plasma-activated bonding is described in U.S. Pat. No. 6,180,496 to Farrens et al., assigned to Silicon Genesis Corporation.

Figure 6:
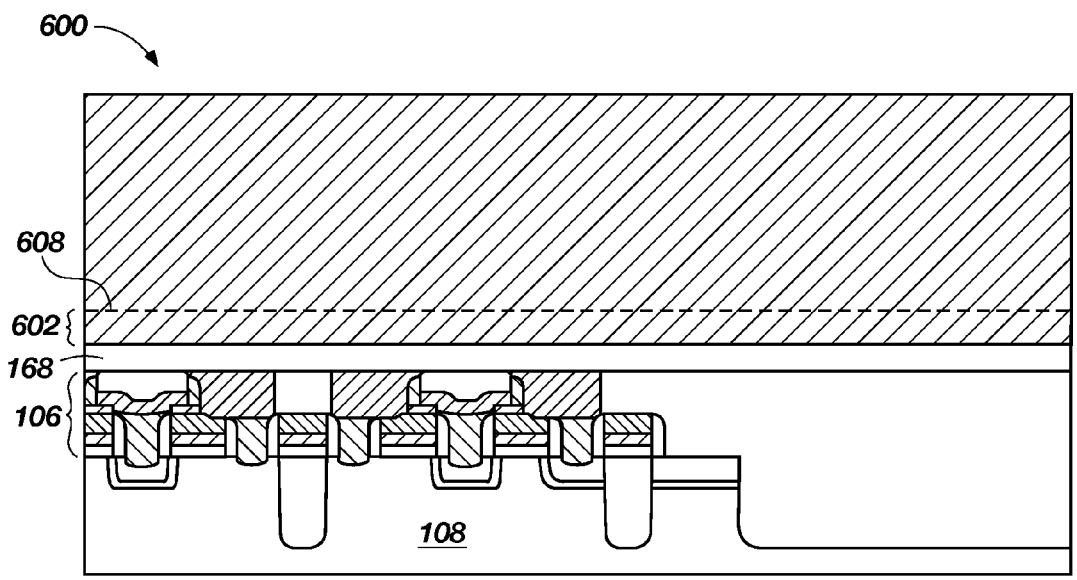

As shown in FIG. 6, the donor wafer 600 is disposed on a surface of the foundation material 168 and may be bonded to the foundation material 168 using an annealing process as described above. The hydrogen or other ions implanted in ion implanted region 602 to the depth of inner boundary 608 makes the silicon in the thermally treated donor wafer 600 susceptible to breakage along inner boundary 608 when a shear force is applied substantially parallel to the major surface of the donor wafer 600. After attaching the donor wafer 600 to the semiconductor structure 101, the portion of the donor wafer 600 on the side of the inner boundary 608 opposing the major surface of the foundation material 168 (the portion of the donor wafer 600 furthest away from the semiconductor structure 101) may be cleaved or fractured by applying a shearing force to the donor wafer 600. The portion of the donor wafer 600 below the inner boundary 608, having a thickness, for example, of between about 20 nm and about 50 nm, is detached from the donor wafer 600 and remains bonded to the semiconductor structure 101 to form the first region 172a including crystalline silicon as shown in FIG. 8.

Figure 7:
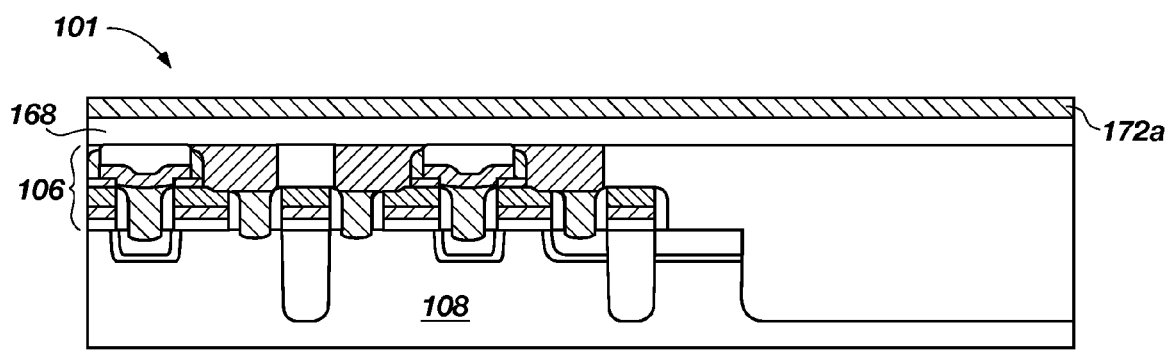

Referring still to FIG. 7, after the implanted region 602 is separated from the donor wafer 600 and bonded over the foundation material 168, forming first region 172a, an exposed surface thereof may be undesirably rough. To remedy this deficiency, the exposed surface of the first region 172a may be smoothed to a desired degree in order to facilitate further processing as described below, according to techniques known in the art such as, for example, one or more of grinding, wet etching, and chemical-mechanical polishing (CMP). After placing the first region 172a on the foundation material 168, second region 174a may be aimed on the first region 172a, as described above. Alternating first regions 172b, 172c and second regions 174b, 174c may be formed to produce the cell stack 170 shown in FIG. 4, with each of the first regions 172b, 172c and second regions 174b, 174c formed as described above. Thus, the cell stack 170 may include polysilicon, germanium, gallium arsenide or silicon germanium, or crystalline silicon, as the first regions 172a, 172b and 172c.

Figure 8:
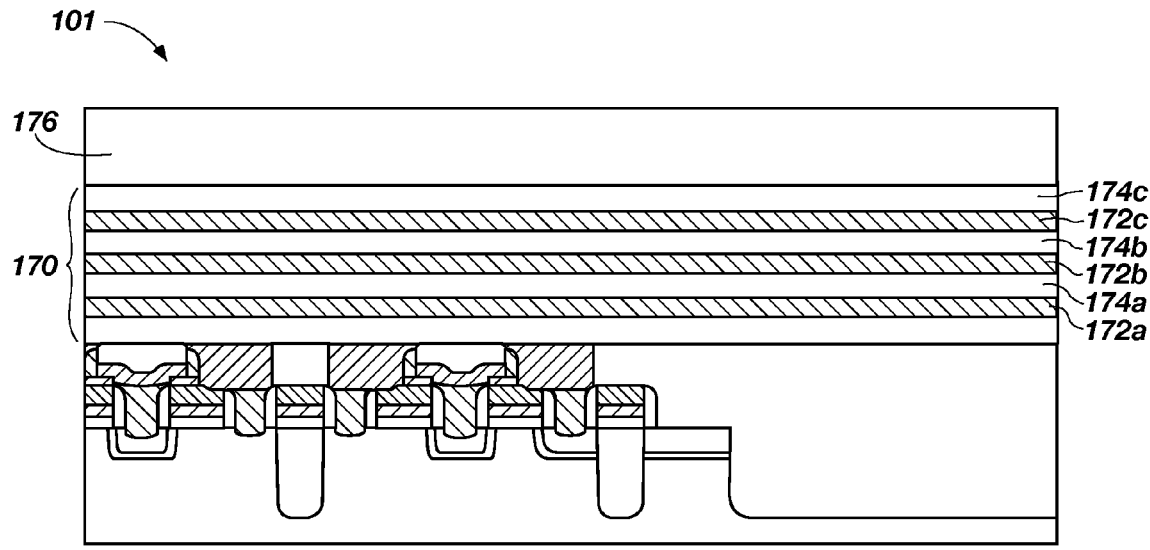

Referring to FIG. 8, a mask material 176 may be formed over semiconductor structure 101. The mask material 176 may include a material having a different etch selectivity than the second regions 174a, 174b and 174c and the first regions 172a, 172b and 172c of the cell stack 170. By way of non-limiting example, the mask material 176 may include a nitride material, such as silicon nitride ($Si_3N_4$), having a thickness of between about 80 nm to about 200 nm and, more particularly, about 120 nm. A conventional chemical vapor deposition (CVD) process, or any other process known in the art of semiconductor fabrication, may be used to form the mask material 176 over the cell stack 170. As another non-limiting example, the mask material 176 may include a hard mask material, such as amorphous carbon or a metal, and may be formed by a conventional chemical vapor deposition (CVD) process, a conventional physical vapor deposition process (i.e., sputtering), or an electroless deposition process.

Figure 9A:
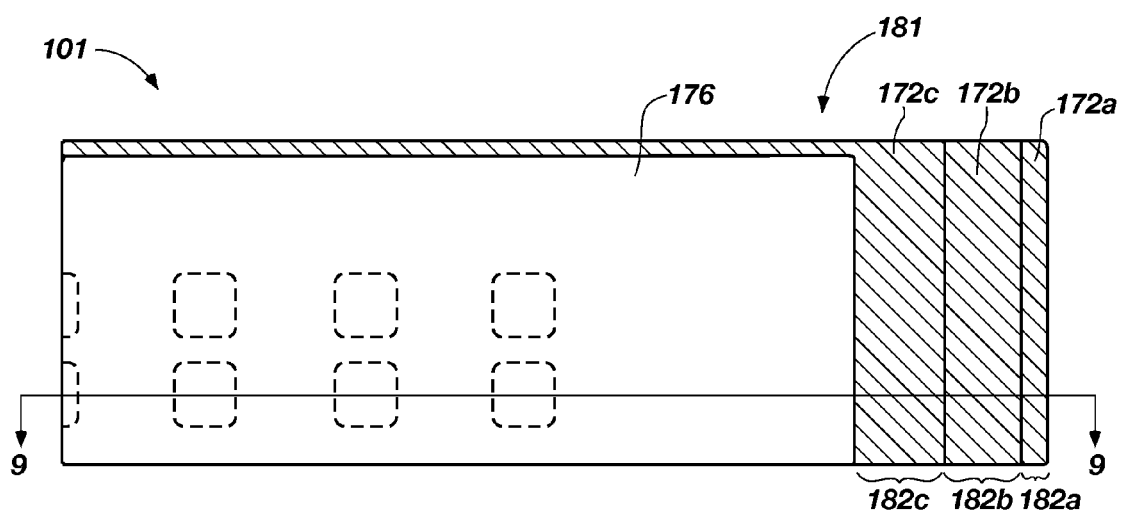

Referring to FIGS. 9A and 9B, portions of each of the mask material 176, the second regions 174a, 174b and 174c and the first regions 172a, 172b and 172c may be removed from a peripheral region 181 of the semiconductor structure 101 to form a plurality of tiers 182a, 182b and 182c. Each of the tiers 182a, 182b and 182c may expose respective portions of the first regions 172a, 172b and 172c that will later be used to form the semiconductive paths (FIG. 1). Referring to FIG. 9B, which is a cross-sectional view of the semiconductor structure 101 shown in FIG. 9A taken along section line 9-9 therein, the semiconductor structure 101 may include a lower tier 182a, an intermediate tier 182b and an upper tier 182c.

As a non-limiting example, the tiers 182a, 182b and 182c may be formed as shown in FIG. 9B1. A first photoresist material 184 may be deposited over the mask material 176 and patterned to expose a surface of the mask material 176 overlying a region of the semiconductor device 101 in which the lower tier 182a (FIG. 9B) will be formed. After removing the portions of the mask material 176, portions of the second region 174c exposed through the mask material 176 may be selectively removed with respect to the mask material 176. For example, if the second region 174c includes silicon dioxide, a reactive ion etching (RIE) process using a nitrogen trifluoride ($NF_3$)-based gas, a chlorine (Cl)-based gas or a bromide (Br)-based gas may be performed to selectively remove the silicon dioxide with respect to the mask material 176. As another non-limiting example, if the second region 174c includes a doped or undoped polyslicon material, a wet etching process may be used to selectively remove the doped or undoped polysilicon material with respect to the mask material 176 and the underlying first region 172c. After removing the portions of the second region 174c, portions of the first region 172c may be exposed through the mask material 176 and the second region 174c. The exposed portions of the first region 172c may then be selectively removed with respect to the mask material 176. As a non-limiting example, if the first region 172c includes polysilicon, a reactive ion etching (RIE) process using a tetrafluoromethane ($CF_4$)-based plasma, hydrogen bromide (HBr)-based plasma or hydrochloric acid (HCl)-based plasma may be performed to remove the polysilicon with respect to the mask material 176. As another non-limiting example, if the first region 172c includes a doped or undoped polysilicon material, a wet etching process may be performed to selectively remove the doped or undoped polysilicon material with respect to the mask material 176 and the underlying second material 174b. The second regions 174b and 174a and the first region 172b exposed through the mask material 176 may be removed, as shown in broken lines, to form the lowermost tier 182a, which is defined by a surface of the first region 172a. As represented by the broken lines designated as 186, an additional portion of the first photoresist material 184 may be removed to expose another portion of the mask material 176 overlying a region of the cell stack 170 in which the intermediate tier 182b will be formed. Thereafter, portions of the mask material 176, the second regions 174c and 174b and the first region 172c exposed through the first photoresist material 184 may be removed, as shown in broken lines, to form the intermediate tier 182b which is defined by a surface of the first region 172b. Another portion of the first photoresist material 184 may be removed overlying a region of the semiconductor structure 101 in which the upper tier 182c will be formed, as represented by the broken lines designated as 188. A portion of the second region 174c exposed through the first photoresist material 184 may be removed to form the upper tier 182c defined by a surface of the first region 172c.

Alternatively, the plurality of tiers 182a, 182b and 182c may be formed as shown in FIG. 9B2. The first photoresist material 184 may be deposited over the mask material 176 and may be patterned to expose a surface of the mask material 176 overlying a region of the semiconductor device 101 in which the upper tier 182c (FIGS. 10A and 10B) will be formed. A portion of the second region 174c exposed through the mask material 176 may be removed to define the upper tier 182c, as shown in broken lines designated as 191, using methods such as those described with respect to FIG. 9B1. A second photoresist material 192 may be deposited and patterned to expose remaining portions of mask material 176 overlying a region of the semiconductor device 101 in which the intermediate tier 182b will be formed. A portion of each of the first region 172c and the second region 174b exposed through the second photoresist material 192 may be removed to form the intermediate tier 182b, as shown in broken lines designated as 193. A third photoresist material 194 may be deposited and patterned to expose remaining portions of the cell stack 170 that will form the lower tier 182a. A portion of each of the first region 172b and the second region 174a exposed through the third photoresist material 194 may be removed to form the lower tier 182c, as shown in broken lines designated as 195.

Figure 10A:
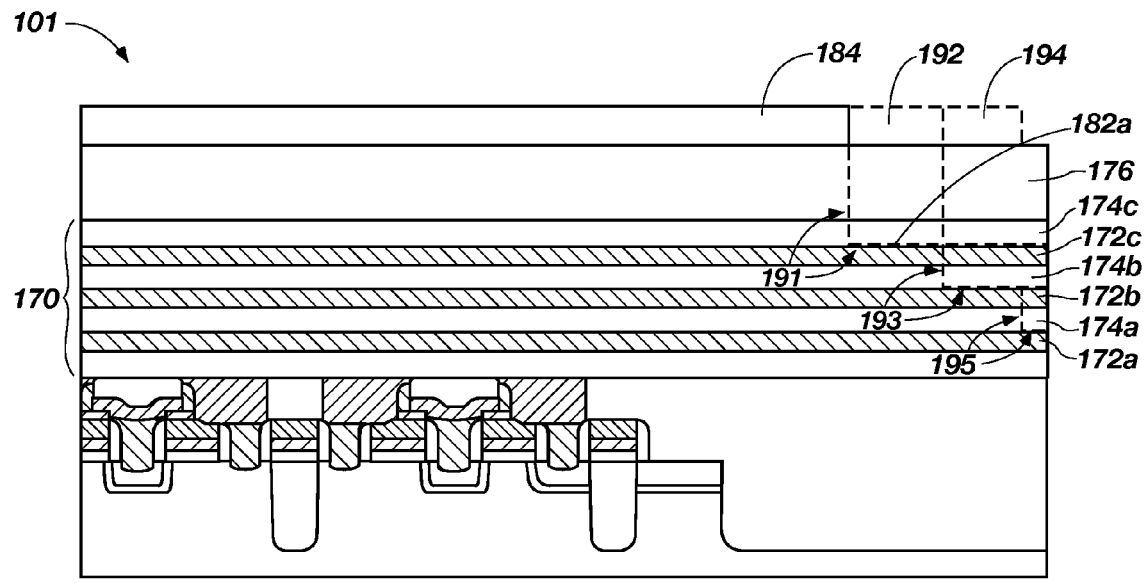
Figure 10A:
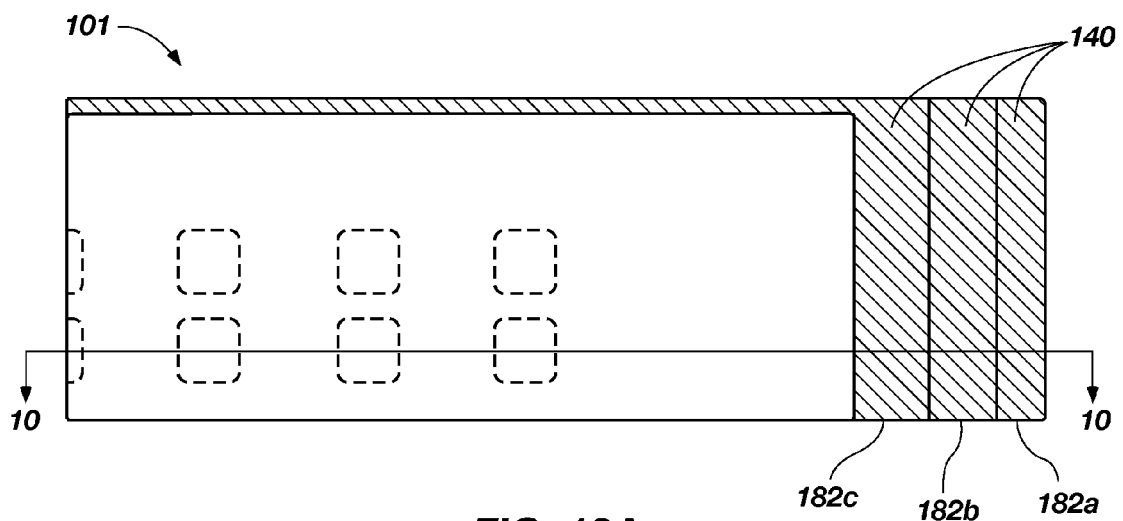
Figure 10B:
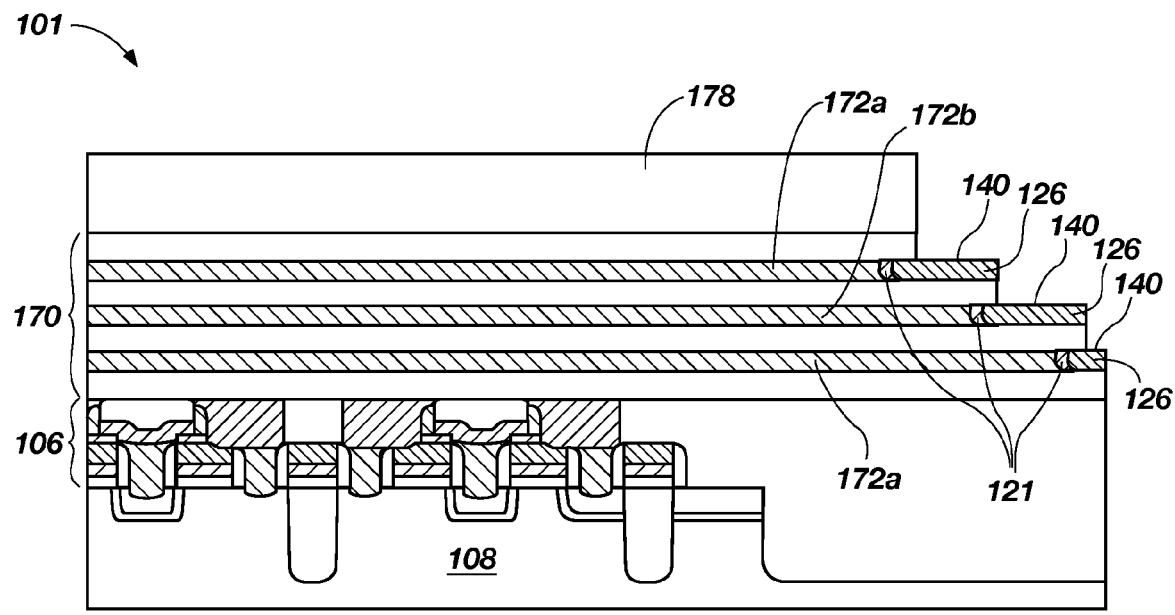

Referring to FIGS. 10A and 10B, the contacts 140 may be formed on the semiconductor structure 101 after forming the plurality of tiers 182a, 182b and 182c. Exposed portions of the first regions 172a, 172b and 172c on the tiers 182a, 182b and 182c may be doped with a desired concentration of a dopant to form doped material 121 and, then, portions of the doped material may be converted to a silicide to form the contacts 140. Exposed portions of the first regions 172a, 172b and 172c may be doped using conventional methods, such as an ion implantation process or a high temperature diffusion process. By way of non-limiting example, if the first regions 172a, 172b and 172c include polysilicon, the semiconductor structure 101 may be exposed to a boron- or an aluminum-containing plasma such that a p-type polysilicon is formed. As another example, a thin film of a p-type material (not shown) may be deposited over surfaces of the semiconductor structure 101 and a thermal anneal may be performed during which p-type dopants migrate into the first regions 172a, 172b and 172c to form p-type polysilicon.

Portions of the doped material of the first regions 172a, 172b and 172c may be converted to a silicide to form the contacts 140. In some embodiments, the contacts 140 may be formed by depositing a non-transition metal, such as cobalt, titanium, tungsten or nickel, over the doped material and heating to temperature sufficient to cause the non-transition metal to react with the doped material 121, forming the silicide regions 126 and the contacts 140. Remaining portions of the doped material 121 may be disposed between the silicide regions 126 and the first regions 172a, 172b and 172c. For example, if the doped material includes a p-type polysilicon, cobalt may be deposited into the p-type polysilicon and annealed at a temperature of between about 400° C. to about 600° C. to form cobalt silicide.

Figure 11A:
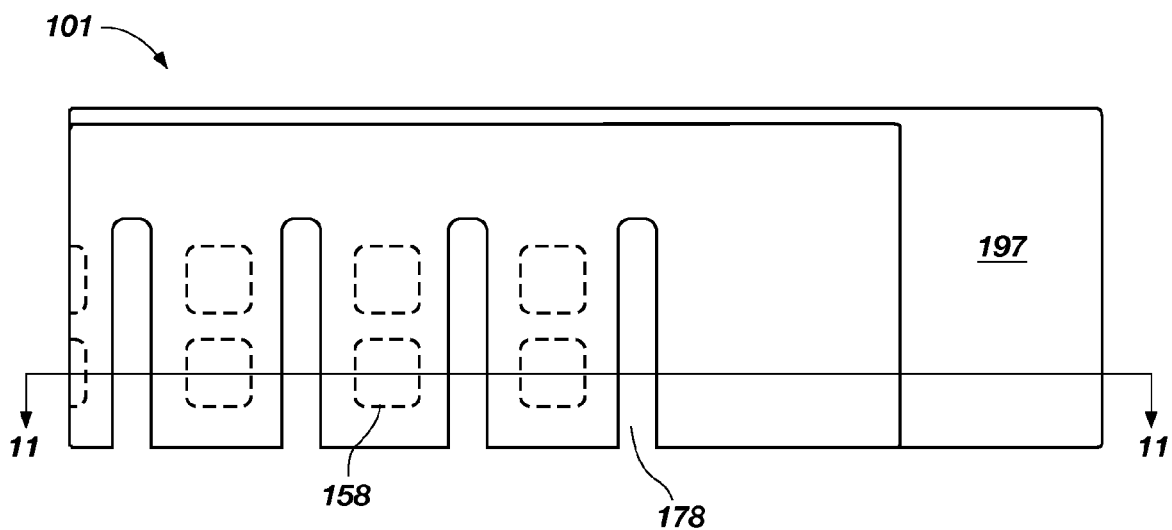
Figure 11B:
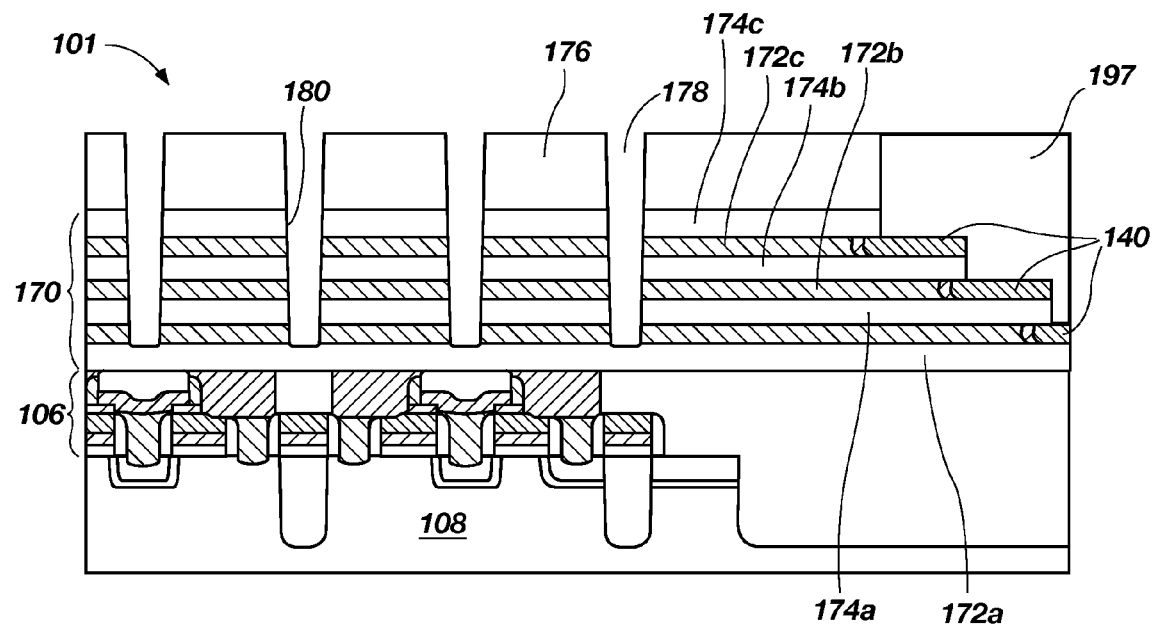

FIG. 11A is a top down view of the semiconductor structure 101 after first slots 178 are formed between the cell plugs 158, each of which is shown in broken lines for the purpose of illustrating the underlying structure. FIG. 11B is a cross-sectional view of the semiconductor structure 101 shown in FIG. 11A taken along the section line 11-11 therein. After forming the contacts 140, a first fill material may be deposited over the peripheral region 181 of the semiconductor structure 101 to form a dielectric rim 197. For example, the first fill material may be an oxide material that is deposited over the semiconductor structure 101 using a conventional process, such as a chemical vapor deposition (CVD) process or a physical vapor deposition (PVD) process. A chemical-mechanical polishing (CMP) process may then be used to remove portions of the oxide material overlying the mask material 176 so that exposed surfaces of the dielectric rim 197 and the mask material 176 are substantially coplanar.

As shown in FIG. 11B, a portion of each of the mask material 176 and the cell stack 170 may be removed to form the first slots 178. As a non-limiting example, the mask material 176 (FIG. 9) may be patterned by providing a photoresist material (not shown) over the mask material 176 and removing portions of the mask material 176 overlying regions of the cell stack 170 that are to be removed (e.g., regions of the cell stack 170 that do not overlie the cell plugs 158). An anisotropic etching process (e.g., a dry reactive ion or plasma etching process) then may be used to etch the regions of the mask material 176 (FIG. 9) exposed through the photoresist material to form openings (not shown) that expose regions of the second region 174c. The photoresist material may then be removed using a conventional ashing process.

After removing the portions of the mask material 176, portions of the second region 174c exposed through the mask material 176 may be selectively removed with respect to the mask material 176 using methods such as those described with respect to FIG. 10B1. For example, if the second region 174c includes silicon dioxide, a reactive ion etching (RIE) process using a nitrogen trifluoride ($NF_3$)-based gas, a chlorine (Cl)-based gas or a bromide (Br)-based gas may be performed to selectively remove the silicon dioxide with respect to the mask material 176. After removing the portions of the second region 174c, portions of the first region 172c may be exposed through the mask material 176 and the second region 174c. The exposed portions of the first region 172c may then be selectively removed with respect to the mask material 176. As a non-limiting example, if the first region 172c includes polysilicon, a reactive ion etching (RIE) process using a tetrafluoromethane ($CF_4$)-based plasma, hydrogen bromide (HBr)-based plasma or hydrochloric acid (HCl)-based plasma may be performed to remove the polysilicon with respect to the mask material 176. The second regions 174b and 174a and the first regions 172b and 172a may be alternately removed as described above to form the first slots 178 extending through the cell stack 170. The foundation material 168 underlying the cell stack 170 may be used as an etch stop during removal of the overlying first region 172a. For example, the remaining portion of the foundation material 168 exposed during the formation of the first slots 178 may have a thickness of about 30 nm.

The first slots 178 may be defined by sidewalls 180 that are perpendicular with the substrate 108 or, alternatively, may taper inward as they extend toward the substrate 108. Optionally, only a selected amount of the foundation material region 168 overlying the MOSFET array 106, if any at all, is removed during the removal of the first region 172a.

Figure 12A:
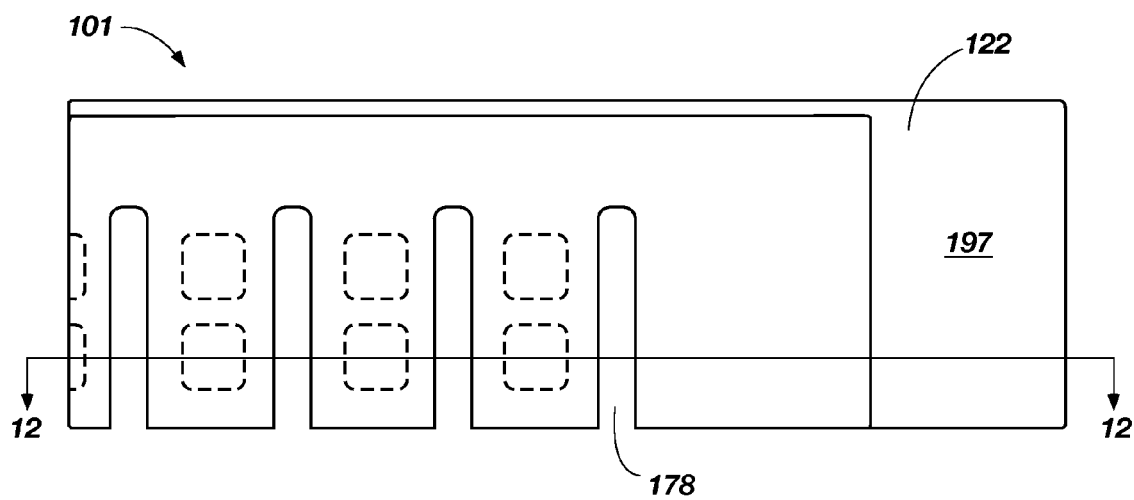

As shown in FIGS. 12A and 12B, exposed portions of the first regions 172a, 172b and 172c (FIGS. 11A and 11B) within the first slots 178 may be doped with a desired concentration of a dopant to form the first doped regions 122. FIG. 12B is a cross-sectional view of the semiconductor structure 101 shown in FIG. 12A taken along the section line 12-12 therein. Exposed portions of the first regions 172a, 172b and 172c may be doped using conventional methods, such as an ion implantation process or a high temperature diffusion process. For example, if the first regions 172a, 172b and 172c include polysilicon, the semiconductor structure 101 may be exposed to a boron- or an aluminum-containing plasma such that a p-type polysilicon is formed. As another example, a thin layer of a p-type material (not shown) may be deposited over surfaces of the semiconductor structure 101 and a thermal anneal may be performed during which p-type dopants migrate into the first regions 172a, 172b and 172c such that the first doped regions 122 include p-type polysilicon.

Figure 13A:
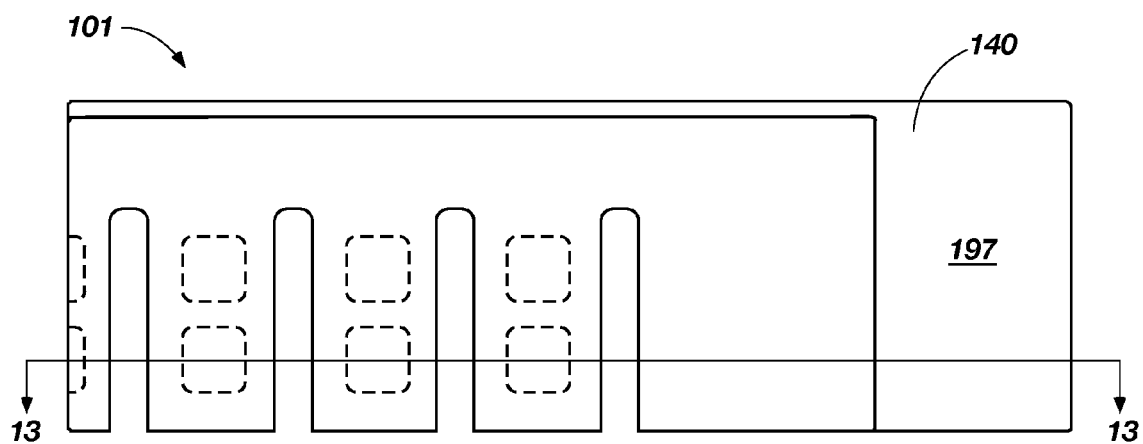
Figure 13B:
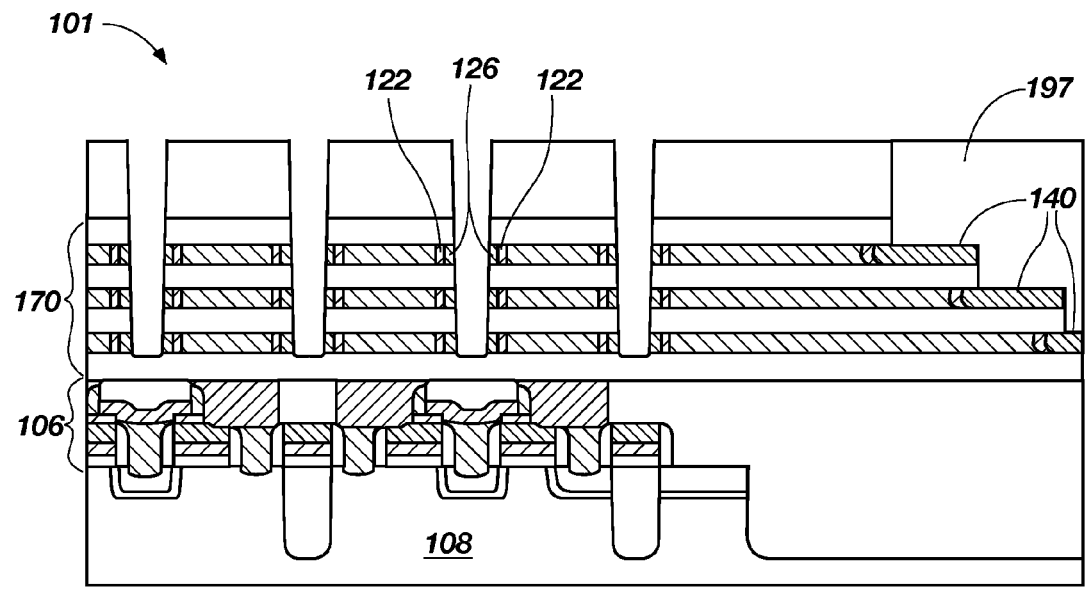

Referring to FIGS. 13A and 13B, exposed portions of the first doped regions 122 may be converted to a silicide to form the silicide regions 126. FIG. 13B is a cross-sectional view of the semiconductor structure 101 shown in FIG. 13A taken along section line 13-13 therein. In some embodiments, the silicide regions 126 and contacts 140 may be formed by depositing a non-transition metal, such as cobalt, titanium, tungsten or nickel, over the first doped regions 122 (FIGS. 12A and 12B) and heating to temperature sufficient to cause the non-transition metal to react with the first doped regions 122, forming the silicide regions 126 and the contacts 140. For example, if the first doped regions 122 include a p-type polysilicon, cobalt may be deposited into the p-type polysilicon and annealed at a temperature of between about 400° C. to about 600° C. to form cobalt silicide. Alternatively, the first doped regions 122 may be undercut using a conventional etchant, such as a mixture of chloropentane ($C_2ClF_5$) and sulfur hexafluoride ($SF_6$). A metal may then be deposited in the undercut region (not shown) and annealed using conventional methods to form the silicide regions 126 and the contacts 140.

Figure 14A:
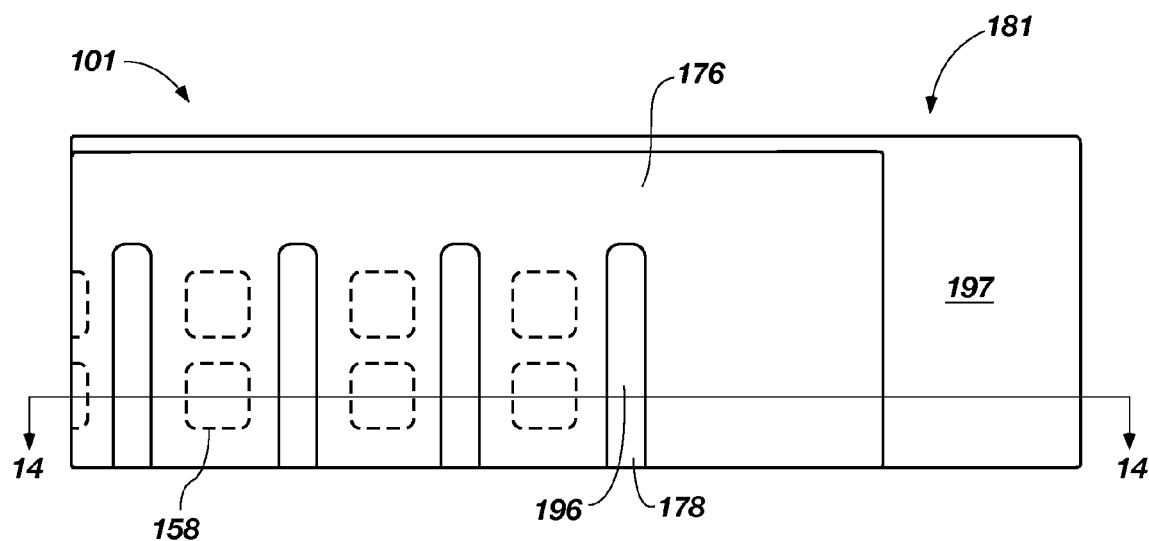
Figure 14B:
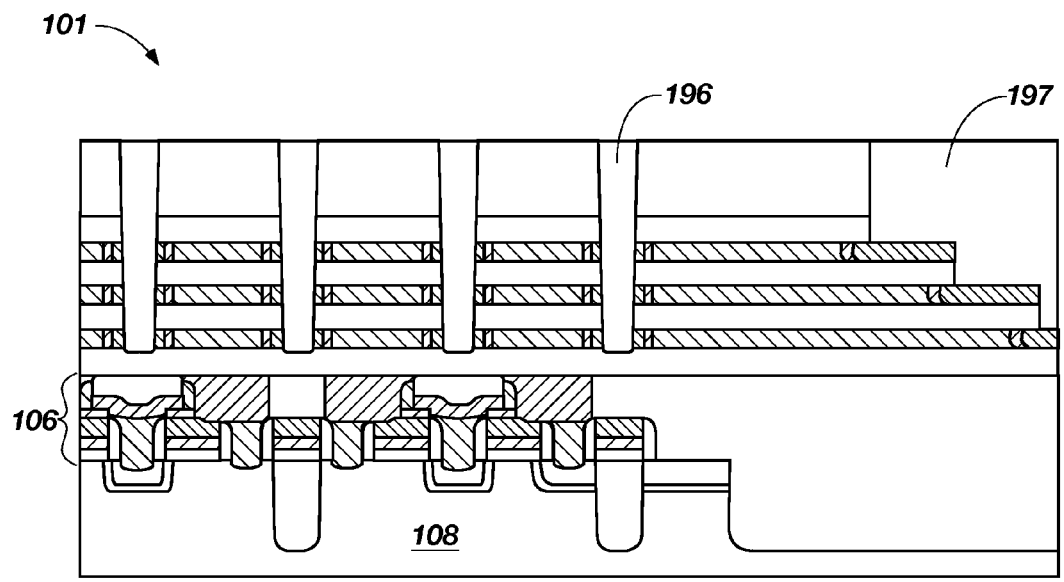

As shown in FIGS. 14A and 14B, another fill material may be deposited in the first slots 178 to form dielectric studs 196. FIG. 14B is a cross-sectional view of the semiconductor structure 101 shown in FIG. 14A taken along section line 14-14 therein. For example, the fill material may be an oxide material that is deposited over the semiconductor structure 101 using a conventional process, such as a chemical vapor deposition (CVD) process or a physical vapor deposition (PVD) process. A chemical-mechanical polishing (CMP) process may then be used to remove portions of the oxide material overlying the mask material 176 so that an upper surface of the semiconductor device 101 is substantially planar.

Figure 15A:
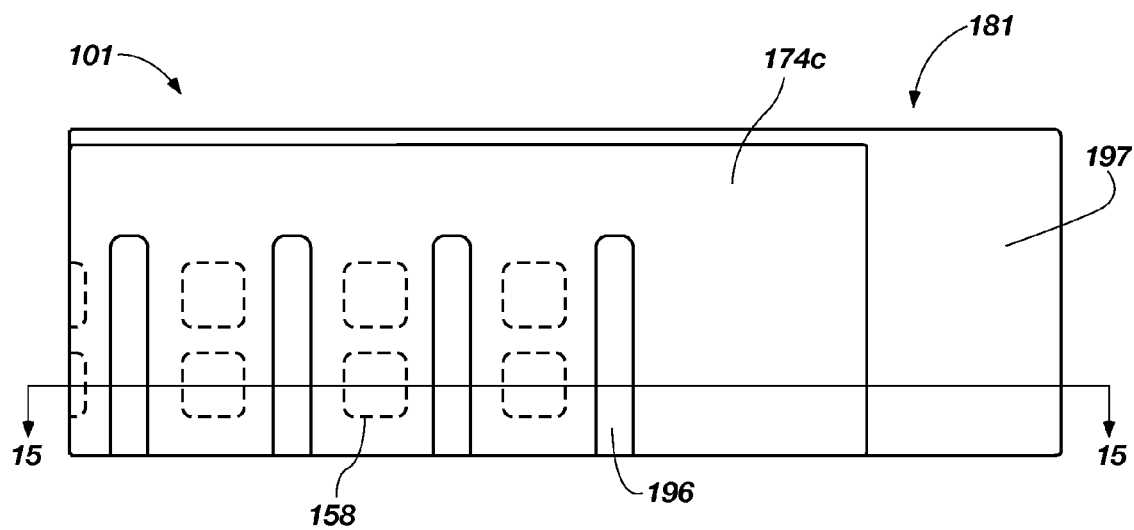
Figure 15B:
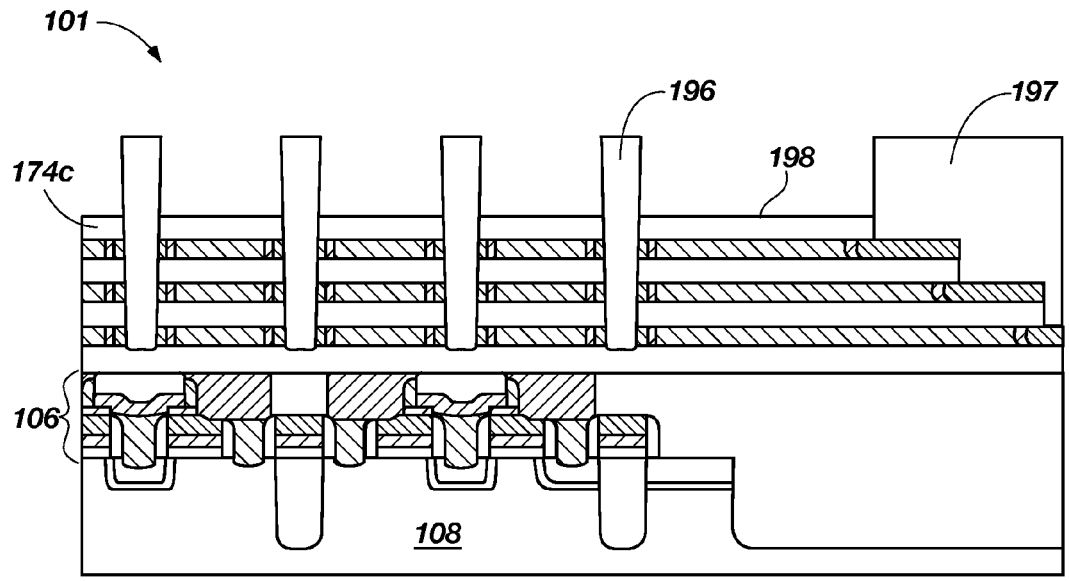

As shown in FIGS. 15A and 15B, the mask material 176 may be removed from the semiconductor structure 101, exposing surfaces of remaining portions of the second region 174c. The mask material 176 may be removed using a conventional wet etching process that selectively removes the mask material 176 with respect to the dielectric studs 196, the dielectric rim 197 and remaining portions of the second region 174c. For example, if the mask material 176 is a nitride material, a phosphoric acid ($H_3PO_4$) etchant having a temperature of between about 140° C. and about 150° C. may be applied to remove the nitride material from the semiconductor structure 101. FIG. 15B is a cross-sectional view of the semiconductor structure 101 shown in FIG. 15A taken along section line 15-15 therein. As shown in FIG. 15B, after removing the mask material 176, portions of the dielectric studs 196 and the dielectric rim 197 protrude above exposed surfaces 198 of the second region 174c and have a height about equal to a thickness of the mask material 176 (i.e., between about 80 nm to about 200 nm and, more particularly, about 120 nm).

Figure 16A:
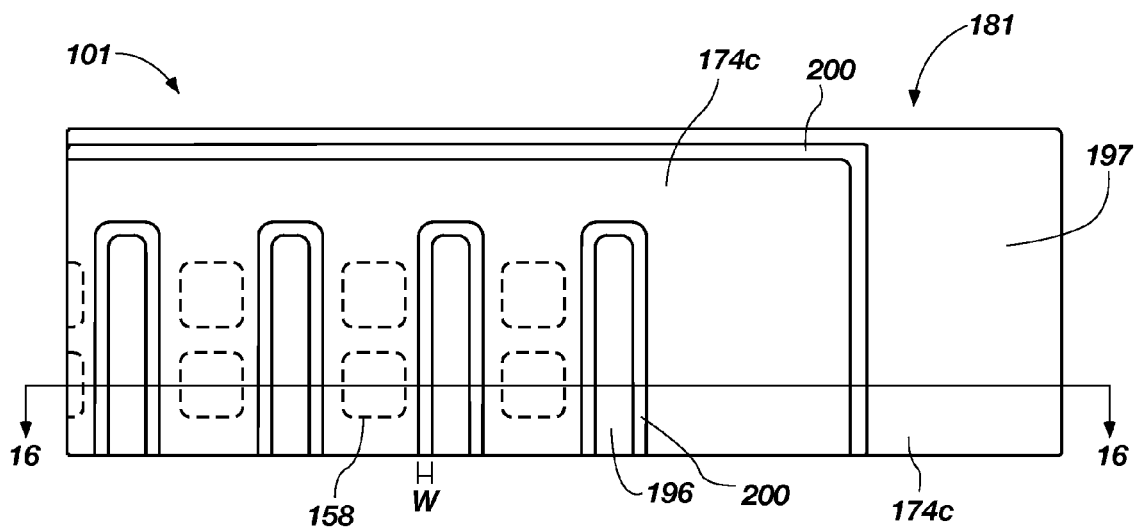
Figure 16B:
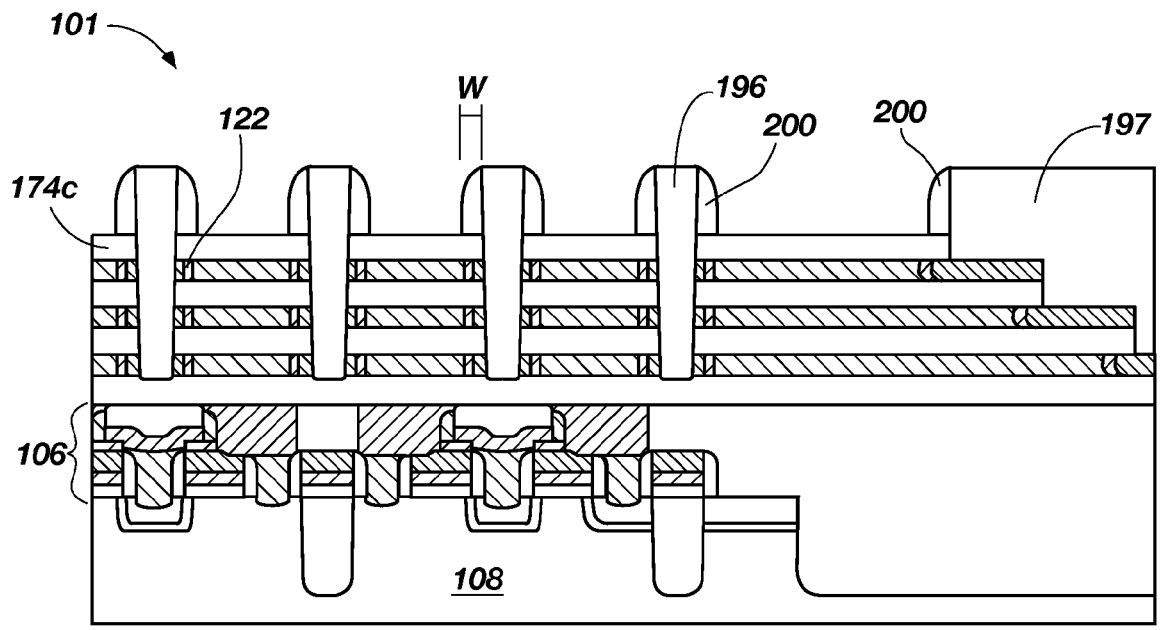

Referring to FIGS. 16A and 16B, spacers 200 may be formed on exposed sidewalls of the dielectric studs 196 and a sidewall of the dielectric rim 197 using a conventional spacer etching process. FIG. 16B is a cross-sectional view of the semiconductor structure 101 shown in FIG. 16A taken along section line 16-16 therein. A base of each of the spacers 200 abutting the second regions 174c may have a width W sufficient to substantially cover the underlying first doped regions 122 such as, for example, from about of about 35 nm to about 100 nm. The spacers 200 may be formed from a hard mask material, such as, for example, tungsten, titanium nitride (TiN$_2$) or tungsten silicide. For example, tungsten having a substantially conformal thickness may be formed over the exposed surfaces of the second region 174c and the dielectric studs 196 and the dielectric rim 197, and a reactive ion etching (RIE) process using chlorine (Cl$_2$) as an etchant may be used to form the spacers 200.

Figure 17:
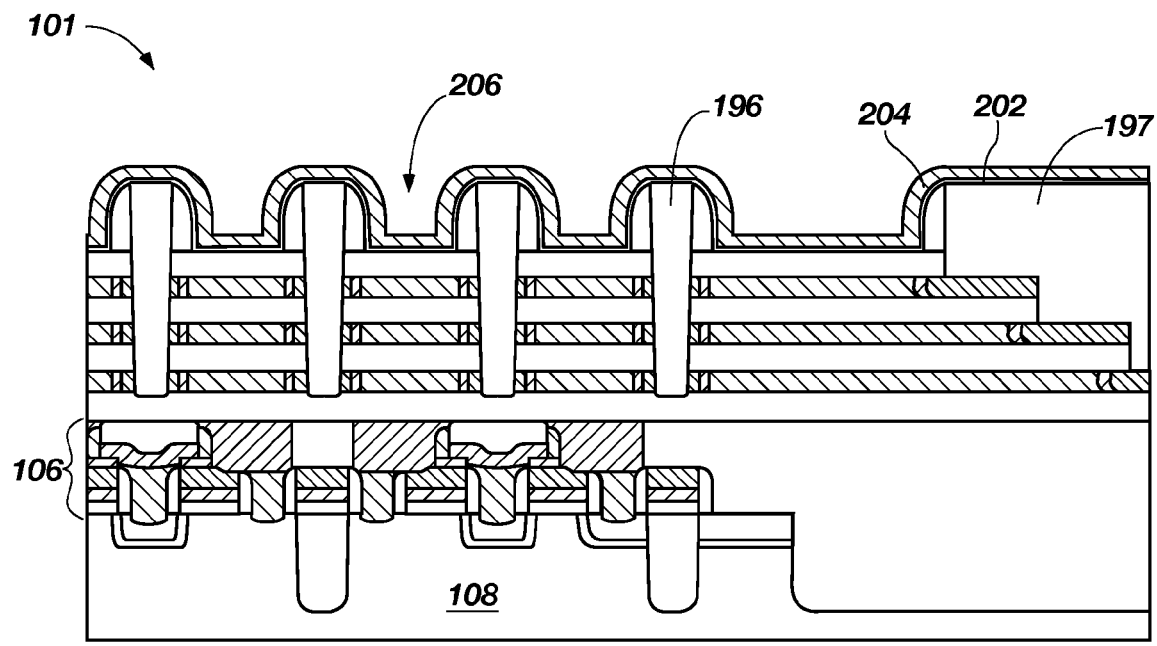

As shown in FIG. 17, a first liner 202 may be deposited over the surface of the semiconductor structure 101, followed by deposition of a sacrificial material 204 over the first liner 202. The first liner 202 may be formed from a material that is resistant to an etchant capable of etching the sacrificial material 204 and the spacers 200 such as, for example, silicon nitride or tantalum nitride (TaN). The first liner 202 may be deposited to a thickness of between about 5 nm to about 10 nm using a conventional chemical vapor deposition (CVD) process. The sacrificial material 204 may be an oxide material, such as, silicon dioxide. The sacrificial material 204 may be deposited to a thickness sufficient such that a gap 206 between portions of the sacrificial material 204 covering protruding regions of the dielectric studs 196 and the dielectric rim 197 is about 50 nm. For example, the sacrificial material 204 may be deposited to a thickness of from about 25 nm to about 35 nm using a conventional chemical vapor deposition (CVD) process or an atomic layer deposition (ALD) process.

Figure 18A:
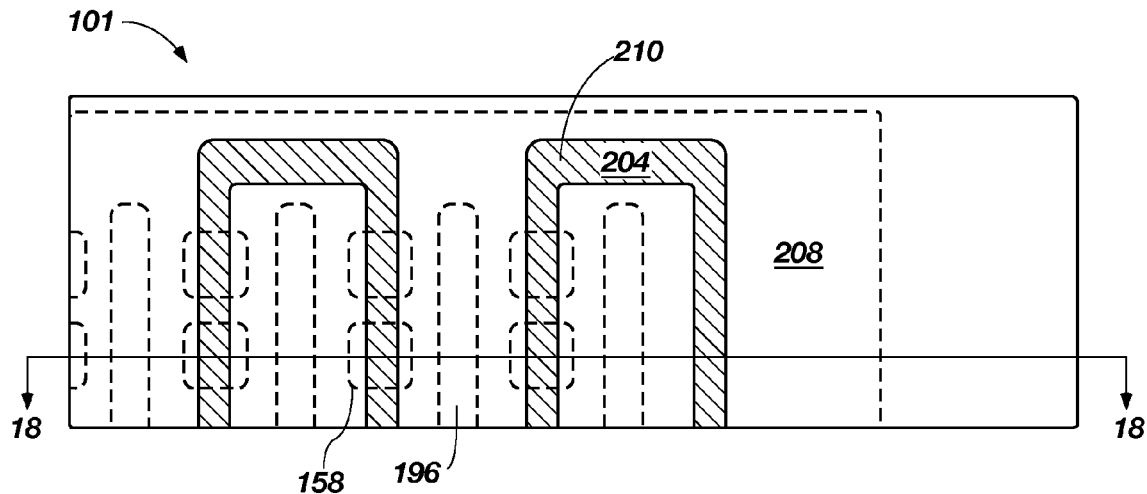
Figure 18B:
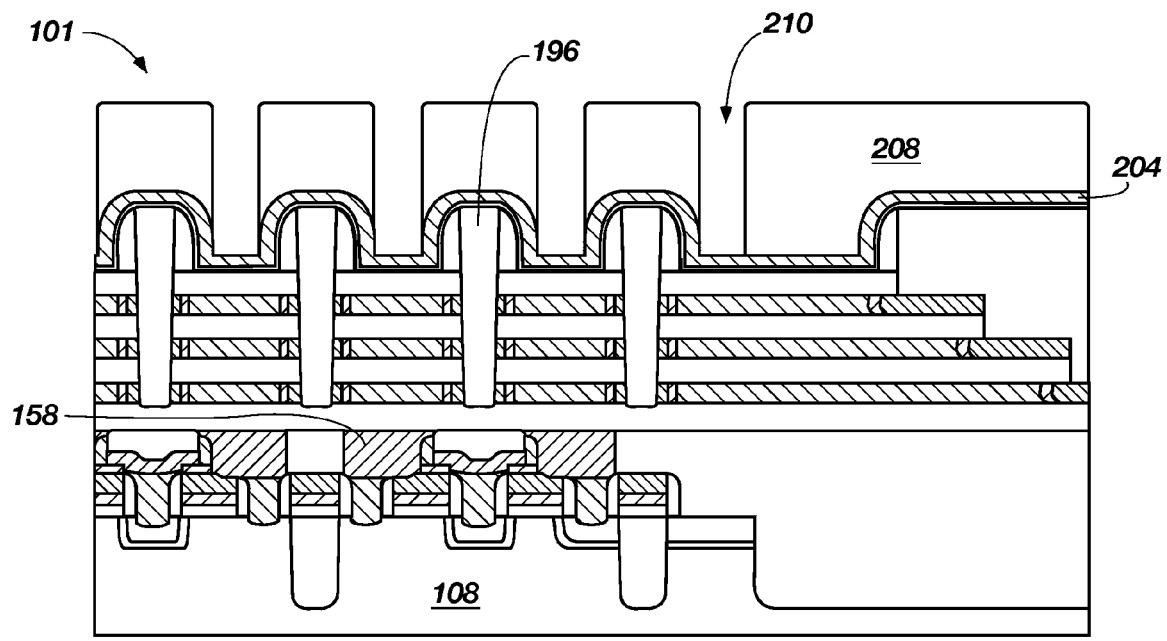

As shown in FIGS. 18A and 18B, another mask material 208 may be formed over the sacrificial material 204 and may be patterned to include openings 210 that expose portions of the sacrificial material 204 between each of the dielectric studs 196 and overlying the cell plugs 158. For the purposes of illustrating the underlying structure, the dielectric studs 196 and the cell plugs 158 are shown in broken lines in FIG. 18A. The mask material 208 may include, for example, a photoresist material, transparent carbon or amorphous carbon, methods for forming that are known in the art. FIG. 18B is a cross-sectional view of the semiconductor structure 101 shown in FIG. 18A taken along section line 18-18 therein. As shown in FIG. 18B, the mask material 208 has been formed over protruding portions of the sacrificial material 204 overlying dielectric studs 196, while the openings 210 expose portions of the sacrificial material 204 in the recesses positioned above the cell plugs 158.

Figure 19A:
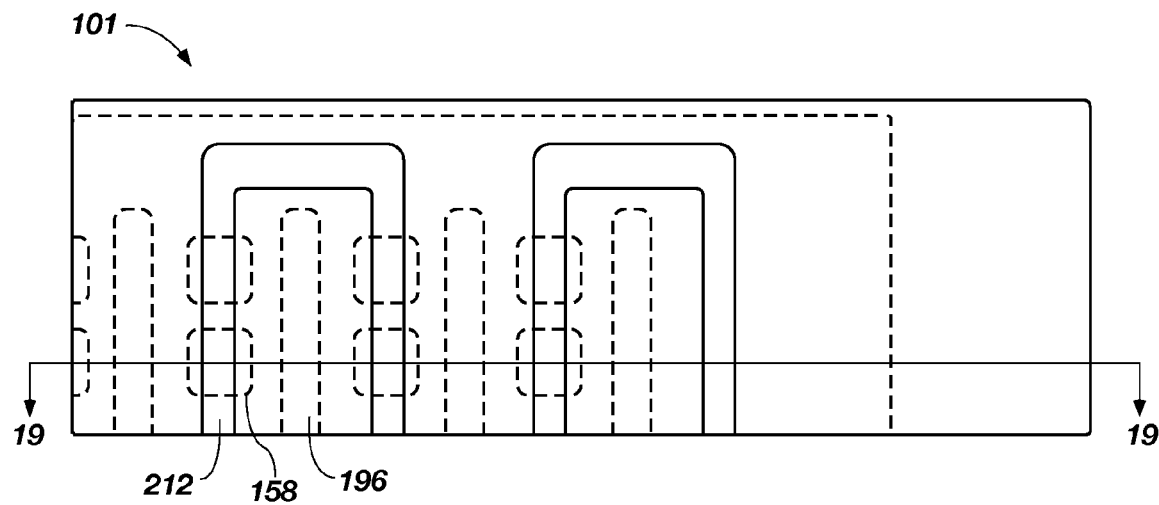
Figure 19B:
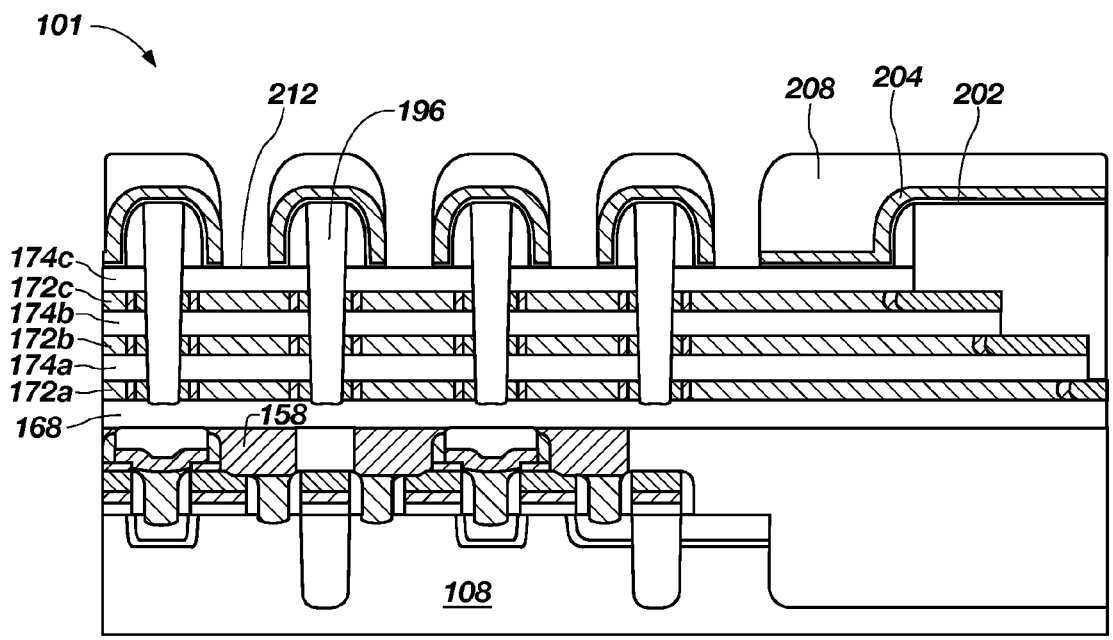

FIG. 19A is a top down view of the semiconductor structure 101 after a plurality of second slots 212 have been formed therein. The underlying cell plugs 158 and the underlying dielectric studs 196 are shown in broken lines in FIG. 19A for the purposes of illustrating the underlying structure. FIG. 19B is a cross-sectional view of the semiconductor structure 101 shown in FIG. 19A taken along section line 19-19 therein. Each of the second slots 212 may circumscribe one of the dielectric studs 196 and may be positioned over one of the cell plugs 158. To form the second slots 212, portions of the sacrificial material 204, the first liner 202, the second regions 174c, 174b and 174a and the first regions 172c, 172b and 172a overlying the cell plugs 158 may be removed through the openings 210 in the mask material 208. For example, a dry (i.e., plasma) etching process may be used to remove the sacrificial material 204 and the first liner 202 selective to the mask material 208. The processing parameters for such a dry etching process will depend upon the compositions of the sacrificial material 204 and the first liner 202 selective to the mask material 208, and various anisotropic plasma etching processes are known in the art for etching many dielectric materials. The second regions 174c, 174b and 174a and the first regions 172c, 172b and 172a may be respectively removed with respect to the mask material 208 using methods such as those described with respect to FIGS. 9B1 and 9B2 to expose a portion of the foundation material 168. The mask material 208 may be removed after forming the second slots 212.

Figure 20:
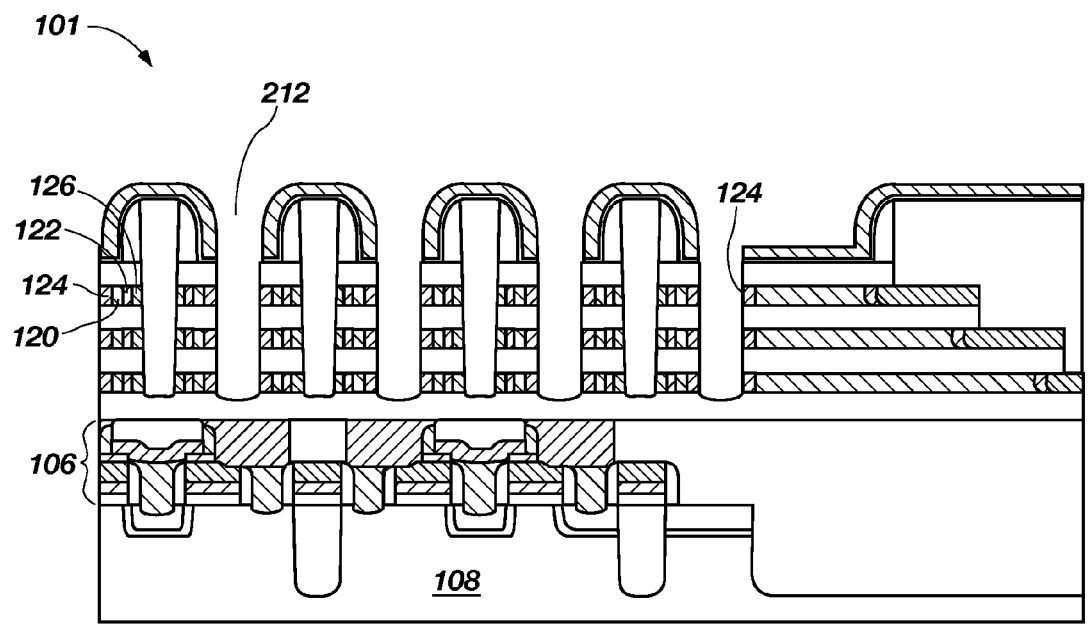

FIG. 20 shows the semiconductor structure 101 after formation of the second doped regions 124. The second doped regions 124 may be formed by doping portions of the first regions 172a, 172b and 172c exposed within the second slots 212 with a desired concentration of a dopant. The second doped regions 124 may be formed by a conventional process, such as an ion implantation process or a high temperature diffusion process. For example, the second doped regions 124 may be formed by a plasma doping process, often referred to as a PLAD process, during which a desired dopant is ionized in an ion source, the resultant ions are accelerated to form an ion beam of prescribed energy, and the ion beam is then directed at a surface of a material, such as polysilicon, so that the ions penetrate into the material. As a non-limiting example, if the first regions 172a, 172b and 172c are polysilicon, a PLAD process may be used to implant phosphorous or arsenic such that the second doped regions 124 comprise n-type polysilicon. As another example, a thin layer of a n-type material may be deposited over surfaces of the semiconductor structure 101 and a thermal anneal may be performed during which n-type dopants migrate into the first regions 172a, 172b and 172c such that the second doped regions 124 include n-type polysilicon.

Figure 21A:
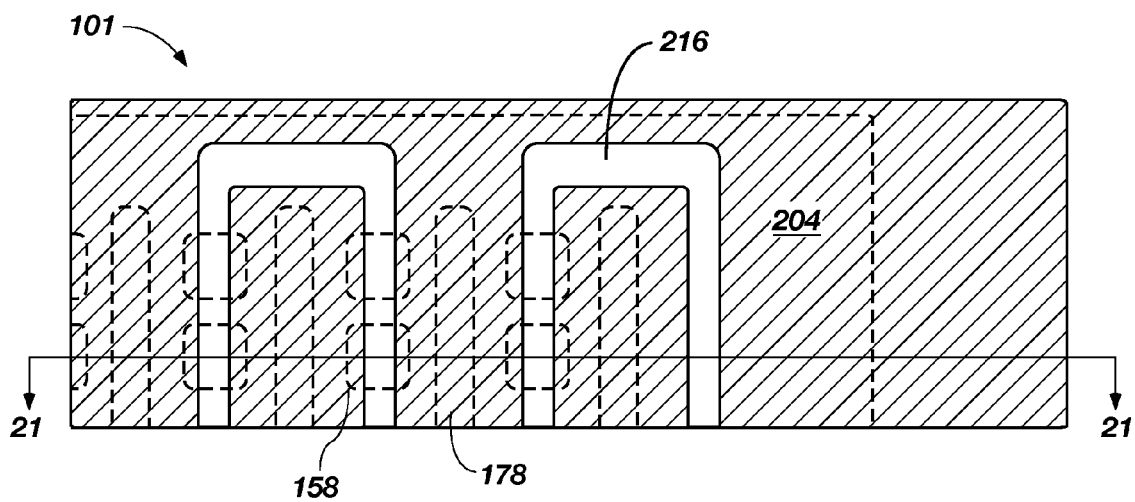
Figure 21B:
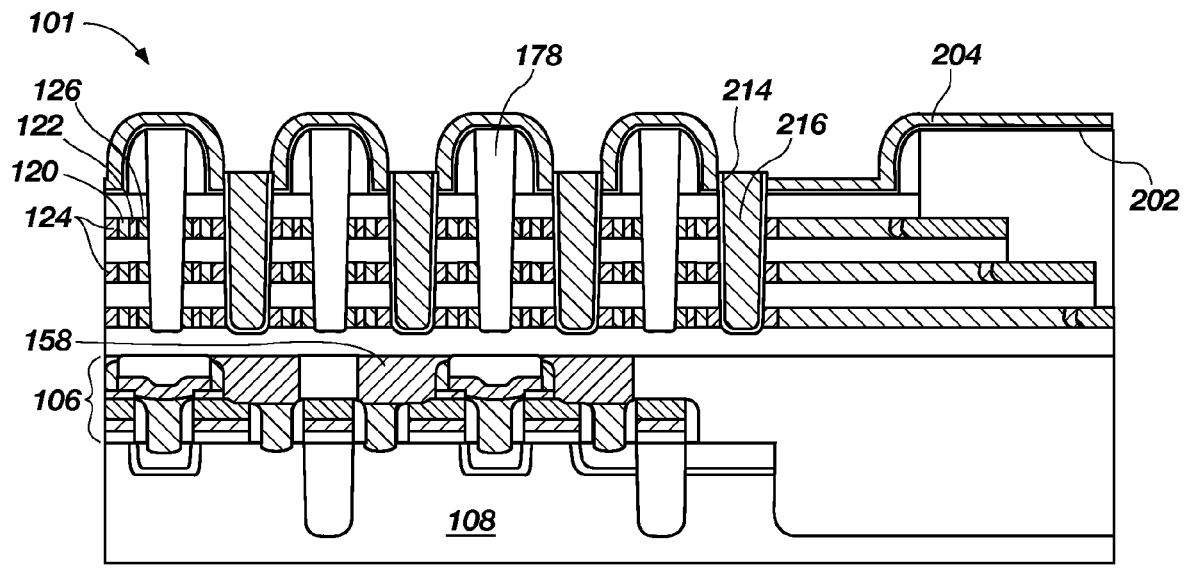

After forming the second doped regions 124, a second liner 214 may be formed over exposed sidewalls of the second slots 212 and the remaining portion of the second slots 212 may be filled with a polysilicon material to form sacrificial plugs 216, as shown in FIGS. 21A and 21B. FIG. 21B is a cross-sectional view of the semiconductor structure 101 shown in FIG. 21A taken along section line 21-21 therein. The second liner 214 may be formed from a material that prevents migration of dopants from the second doped regions 124 into the sacrificial plugs 216, such as, for example, a nitride material or an oxide material, and may be deposited using a conventional chemical vapor deposition (CVD) process. As a non-limiting example, the second liner 214 may have a thickness of between about 3 nm to about 8 nm. The sacrificial plugs 216 may be formed by depositing polysilicon using, for example, a conventional chemical vapor deposition (CVD) process or physical vapor deposition (PVD) process followed by an anisotropic dry reactive ion (i.e., plasma) etching process to recess the sacrificial plugs 216 within the second slots 212. The sacrificial material 204 and the first liner 202 may prevent material from being deposited outside of the second slots 212, such as on surfaces of the second region 174c, during deposition of polysilicon to form the sacrificial plugs 216.

Figure 22:
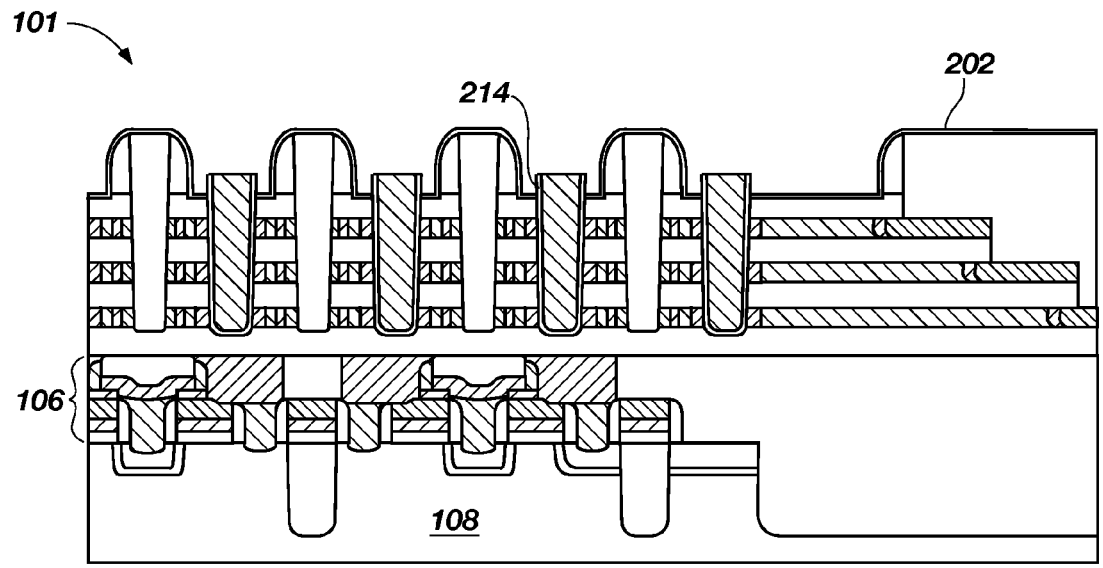

As shown in FIG. 22, the sacrificial material 204 may be removed to expose the first liner 202 using a conventional etching process that selectively removes the sacrificial material 204. As a non-limiting example, if the sacrificial material 204 is an oxide material and the first liner 202 and the second liner 214 are a nitride material, a wet etchant including aqueous hydrochloric acid may be introduced to the semiconductor structure 101 to selectively remove the oxide material with respect to the nitride material.

Figure 23A:
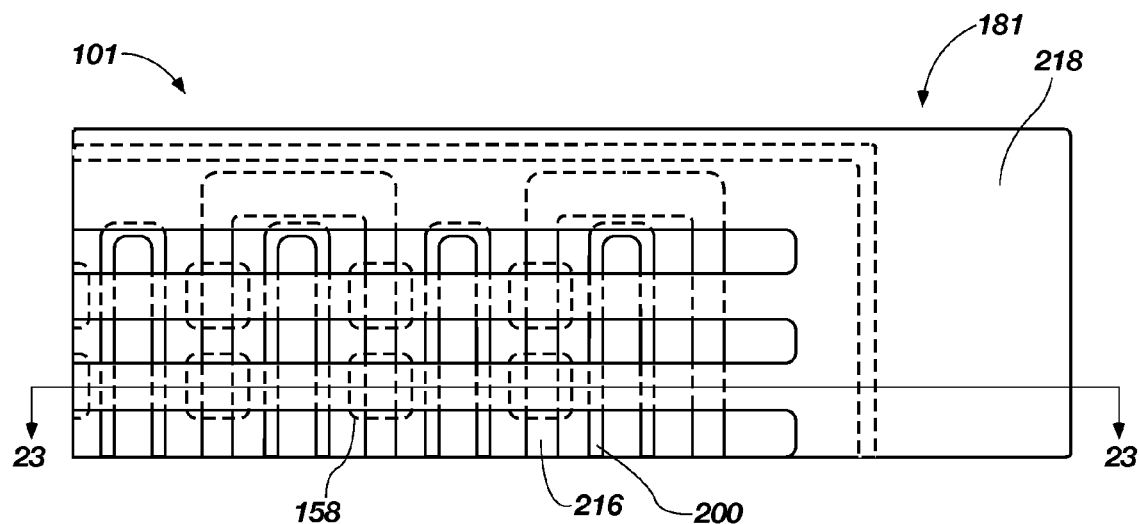
Figure 23B:
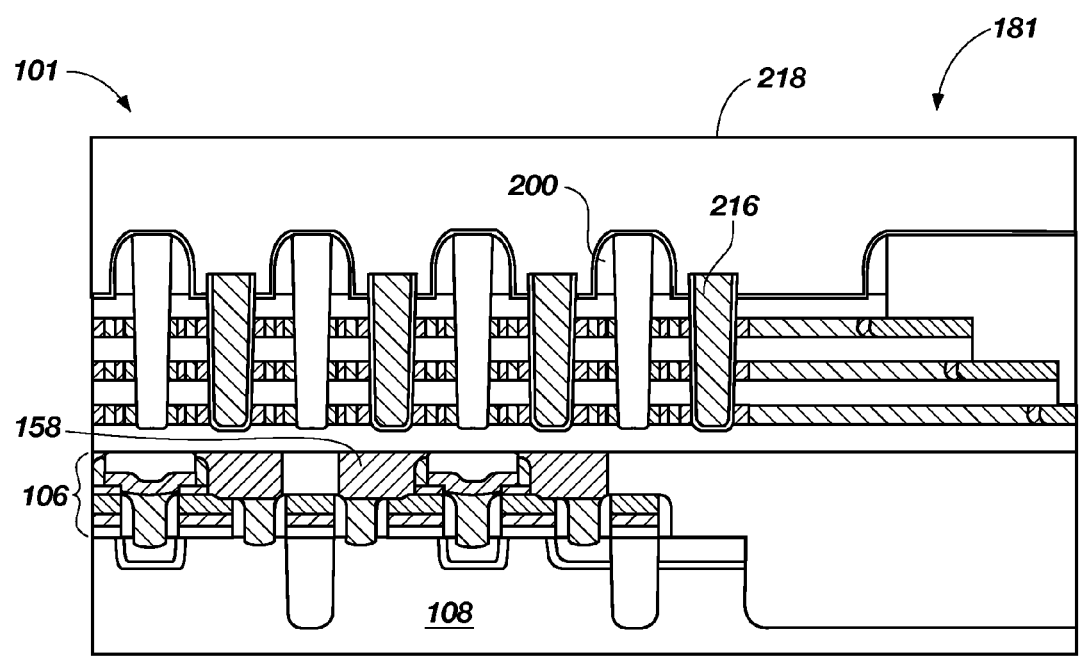

Referring to FIGS. 23A and 23B, after removing the sacrificial material 204, a third mask material 218 may be deposited and patterned to cover a portion of the peripheral region 181 of the semiconductor structure 101 and portions of the sacrificial plugs 216 overlying the cell plugs 158 (broken lines). Portions of the spacers 200, the sacrificial plugs 216, and the cell plugs 158 underlying the mask material 218 are shown in broken lines in FIG. 23A for the purposes of illustrating the underlying structure. FIG. 23B is a cross-sectional view of the semiconductor structure 101 shown in FIG. 23A taken long section line 23-23 therein.

Figure 24A:
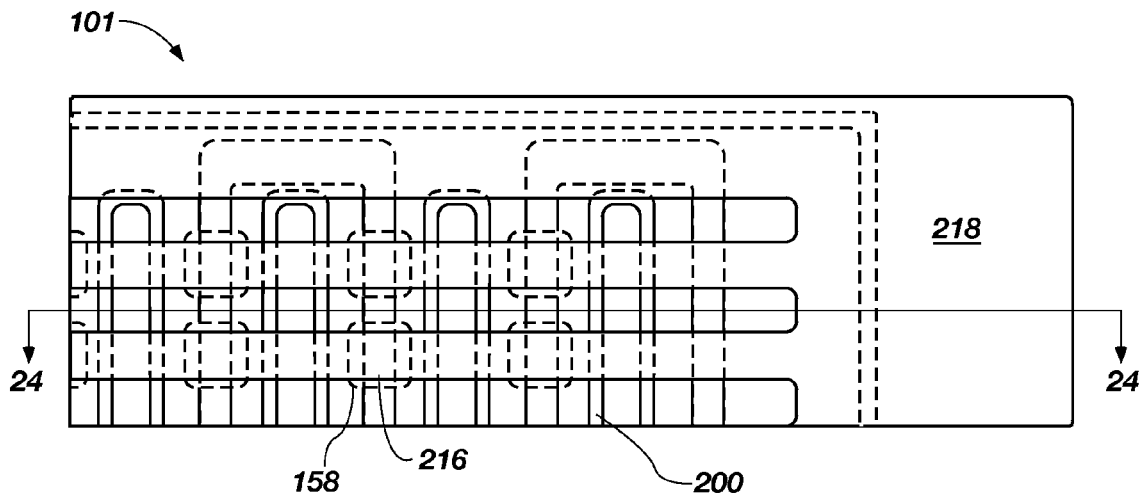
Figure 24B:
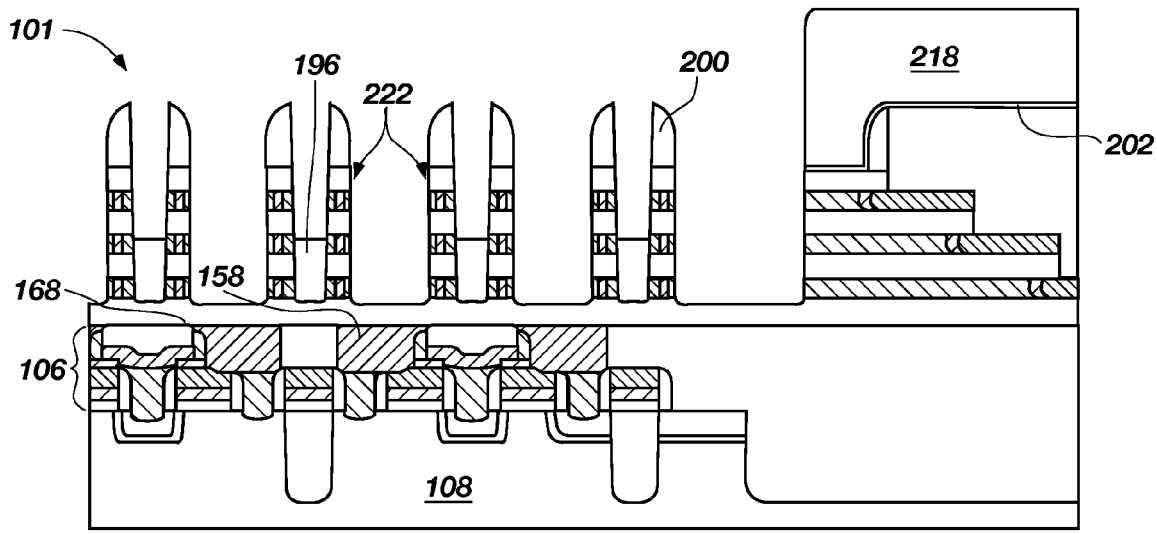

FIG. 24A is a top down view of the semiconductor structure 101 after the material exposed through the mask material 218 and the spacers 200 has been removed. For the purposes of illustrating the underlying structure, the cell plugs 158 are shown in broken lines in FIG. 24A. FIG. 24B is a cross-sectional view of the semiconductor structure 101 shown in FIG. 24A taken along section line 24-24 therein. For example, the first liner 202 may be silicon nitride and exposed portions thereof may be removed using an anisotropic reactive ion (i.e., plasma) etching process. The sacrificial plugs 216 may be removed using, for example, a reactive ion etching (RIE) process. After removing the sacrificial plugs 216, the second liner 214 may be removed using an anisotropic reactive ion (i.e., plasma) etching process. The second regions 174a, 174b and 174c and the second doped regions 124 may be alternately removed using methods such as those described above with respect to FIGS. 9B1 and 9B2 to expose underlying portions of the foundation material 168. At least a portion of the dielectric studs 196 may also be removed to form a plurality of pillars 220. In FIG. 24A, the cell plugs 158, remaining portions of the spacers 200 and remaining portions of the sacrificial plugs 216 (i.e., portions of the sacrificial plugs 216 overlying the cell plugs 158) are shown in broken lines for the purposes of illustrating the underlying structure. Portions of the second doped regions (not shown) between the cell plugs 158 have been removed to singulate the second doped regions overlying each of the cell plugs 158.

Figure 25A:
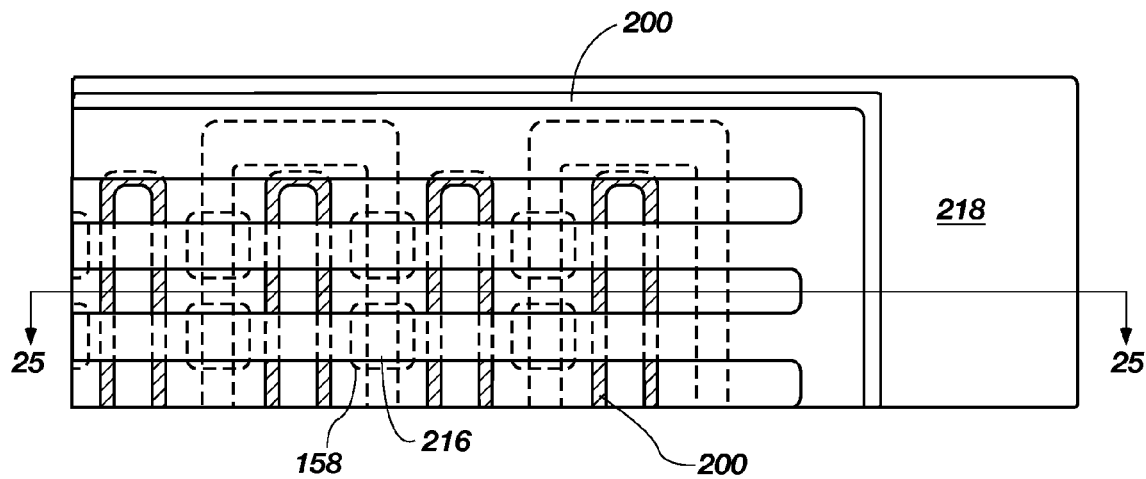
Figure 25B:
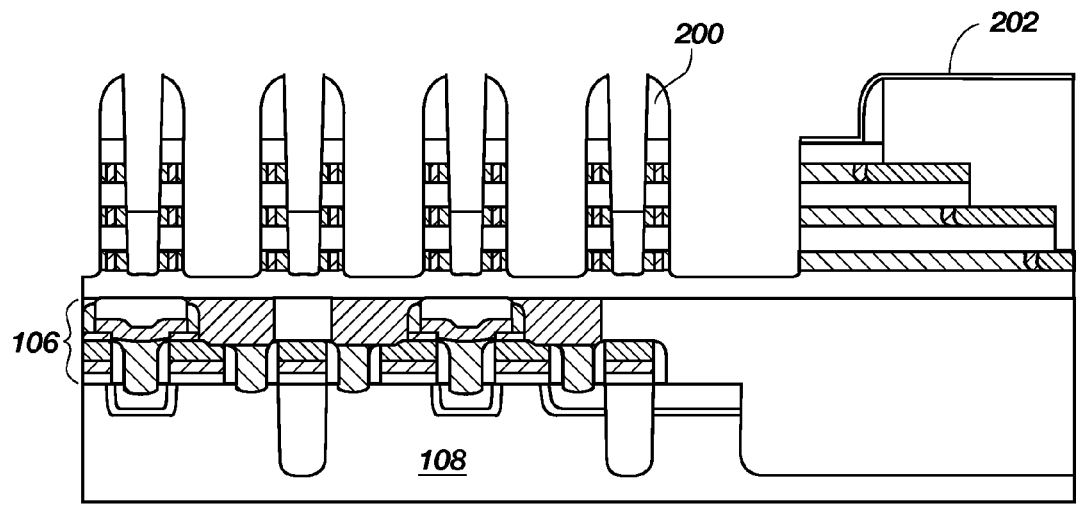

Referring to FIGS. 25A and 25B, FIG. 25B being a cross-sectional view of the semiconductor structure 101 shown in FIG. 25A taken along the section line 25-25 therein, the mask material 218 may be removed to expose the spacers 200 and remaining portions of the first liner 202 overlying the peripheral region 181. For example, the mask material 218 may be removed using a conventional ashing process or a wet etching process using a mixture of ammonium hydroxide ($NH_4OH$), hydrogen peroxide ($H_2O_2$) and water ($H_2O$).

Figure 26A:
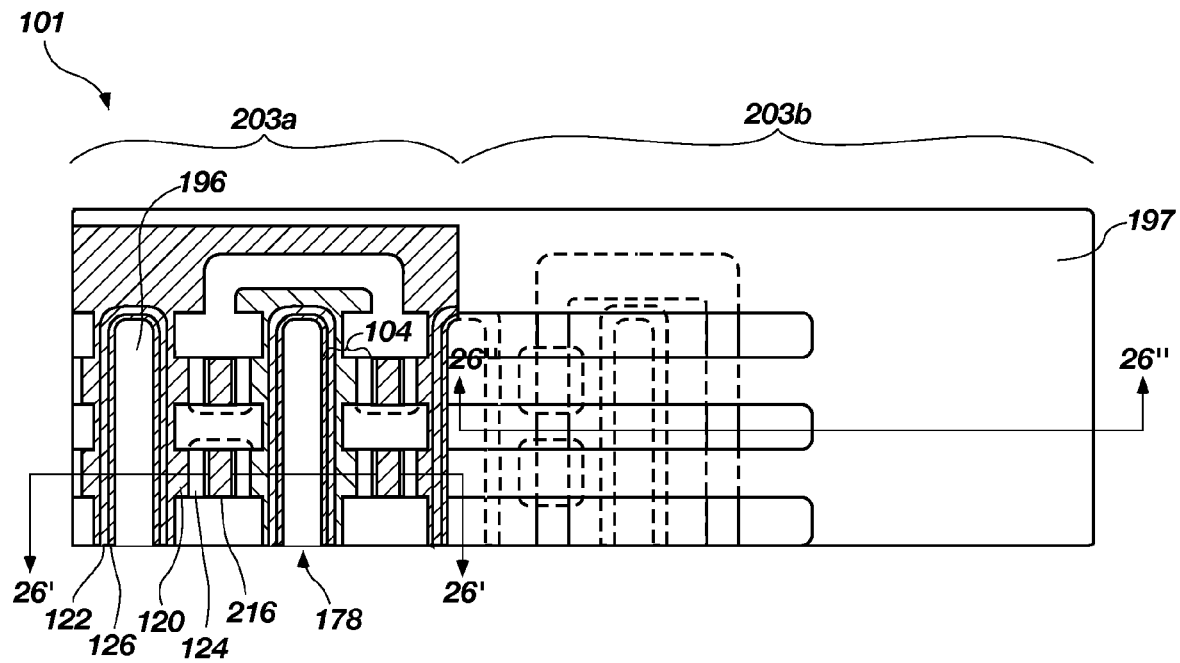
Figure 26B:
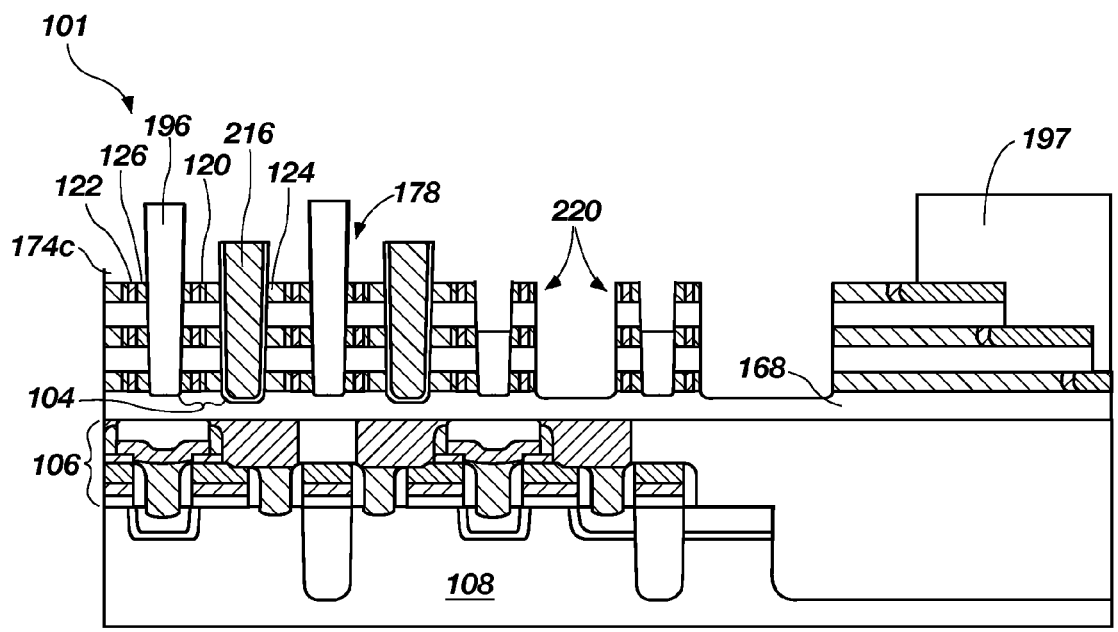

FIGS. 26A and 26B, show the semiconductor structure 101 after the spacers 200 and remaining portions of the first liner 202 have been removed. FIG. 26B is a cross-sectional view of the semiconductor structure 101 shown in FIG. 26A, a portion 203a of which is taken along the section line 26'-26' bisecting the cell plugs 158, and another portion 203b of which is taken along section line 26"-26" extending between the cell plugs 158. The second region 174c has been omitted from the portion 203a for the purposes of illustrating the underlying structure. As a non-limiting example, if the spacers 200 include tungsten, a conventional wet etching process using a mixture of hydrofluoric acid (HF) and nitric acid ($HNO_3$) may be used to remove the tungsten. As shown in FIG. 26A, the sacrificial plugs 216 are positioned over the cell plugs 158, each of which is shown in broken lines. The pillars 220 are disposed between remaining portions of the dielectric studs 196 and the foundation material 168. The second doped regions 124 extend along the sacrificial plugs 216. The first doped regions 122 and the silicide regions 126 circumscribe the fill material 196 in the first slots 178. The intrinsic regions 120 are each disposed between one of the first doped regions 122 and one of the second doped regions 124 to form the diodes 104 between each of the underlying cell plugs 158 (broken lines).

Figure 27A:
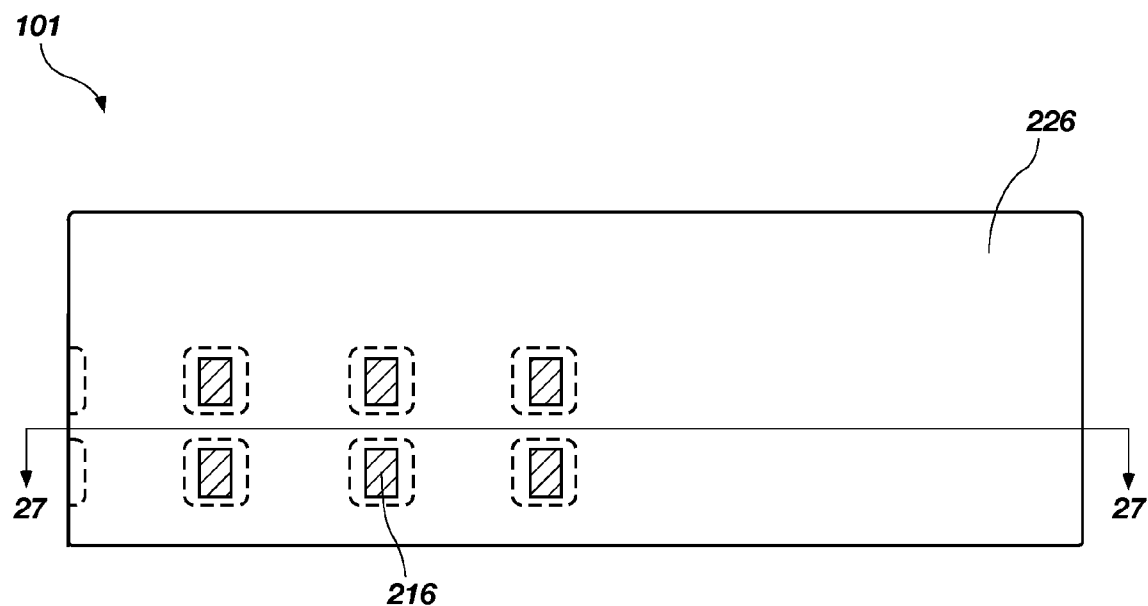
Figure 27B:
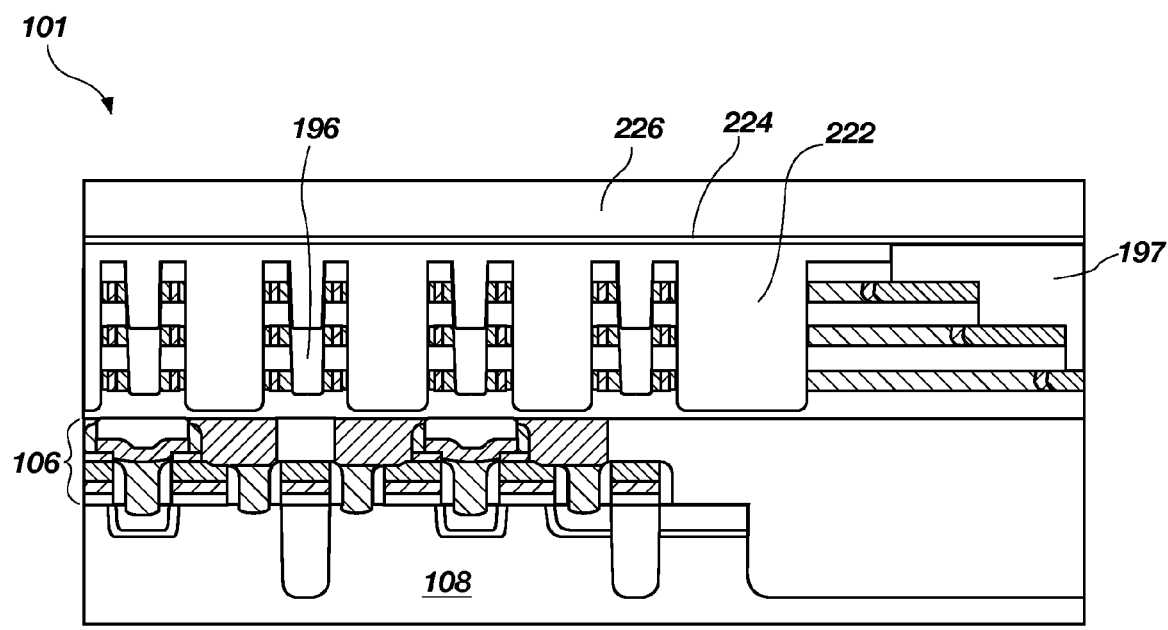

FIGS. 27A and 27B show the semiconductor structure 101 after an upper surface thereof has been planarized and a lower dielectric material 222, a third liner 224, and an intermediate dielectric material 226 have been deposited thereover. FIG. 27B is a cross-sectional view of the semiconductor structure shown in FIG. 27A taken along section line 27-27 therein. The upper surface of the semiconductor structure 101 may be planarized using a chemical-mechanical polishing (CMP) process. The lower dielectric material 222 may include, for example, an oxide material. The lower dielectric material 222 may be deposited over the semiconductor structure 101 to fill recesses therein and may then be planarized using, for example, a chemical-mechanical polishing (CMP) process such that the upper surface of the lower dielectric material 222 is substantially planar. The third liner 224 may include a material capable of being selectively etched with respect to the lower dielectric material 222 and may have a thickness of between about 10 nm and about 30 nm. For example, if the lower dielectric material 222 is silicon dioxide, the third liner 224 may include silicon nitride. The intermediate dielectric material 226 may then be formed over the third liner 224. As a non-limiting example, the intermediate dielectric material 226 may include an oxide material. The lower dielectric material 222, the third liner 224 and the intermediate dielectric material 226 may each be formed using a conventional deposition process such as, for example, a chemical vapor deposition (CVD) process.

Figure 28A:
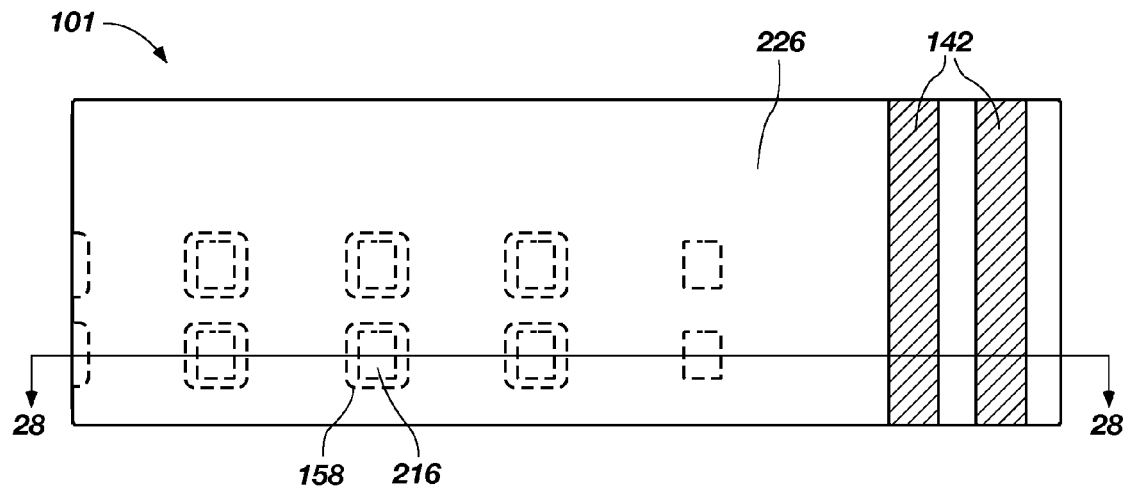
Figure 28B:
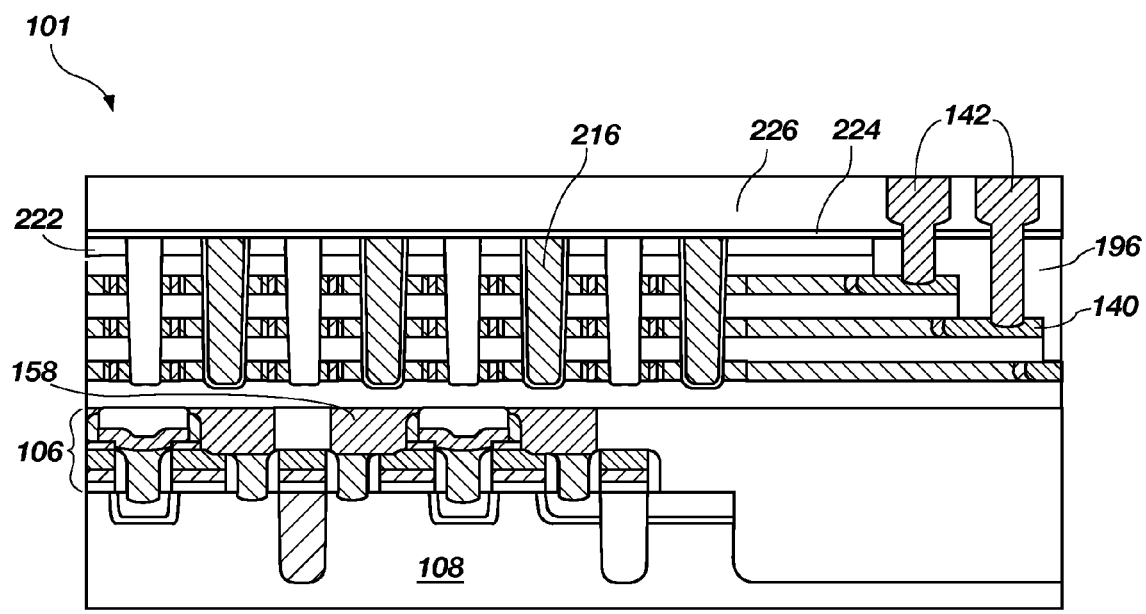

As shown in FIGS. 28A and 28B, line interconnects 142 may be formed, each of which extends through the intermediate dielectric material 226, the third liner 224 and lower dielectric material 222 to one of the contacts 140. FIG. 28B is a cross-sectional view of the semiconductor structure shown in FIG. 28A taken along section line 28-28 therein. The sacrificial plugs 216 and the cell plugs 158 are shown in broken lines in FIG. 28A for the purposes of illustrating the underlying structure. Each of the line interconnects 142 may be formed using conventional lithographic processes. For example, a photoresist (not shown) may be formed over the semiconductor structure 101 and patterned to include apertures (not shown) therein, each of the apertures overlying a location at which it is desired to form one of the line interconnects 142. Portions of the intermediate dielectric material 226, the third liner 224 and the fill material 196 may be removed through each of the apertures using, for example, a conventional anisotropic reactive ion (i.e., plasma) etching process, to expose a surface of the underlying contacts 140. The photoresist may be removed and a conductive material, such as tungsten, aluminum, or copper, may be deposited using a conventional chemical vapor deposition (CVD) process and may be etched back using a conventional chemical mechanical polishing (CMP) process to form the line interconnects 142.

Figure 29A:
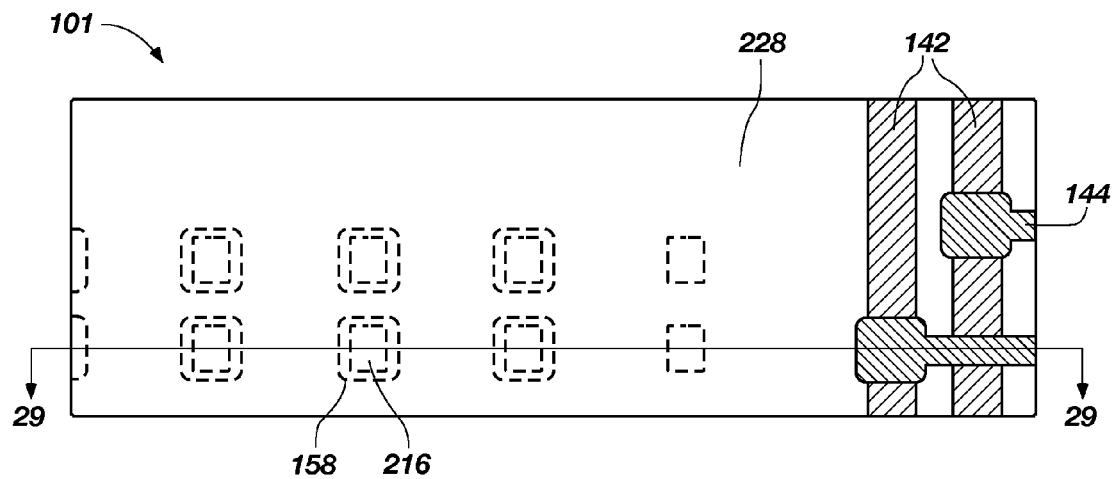
Figure 29B:
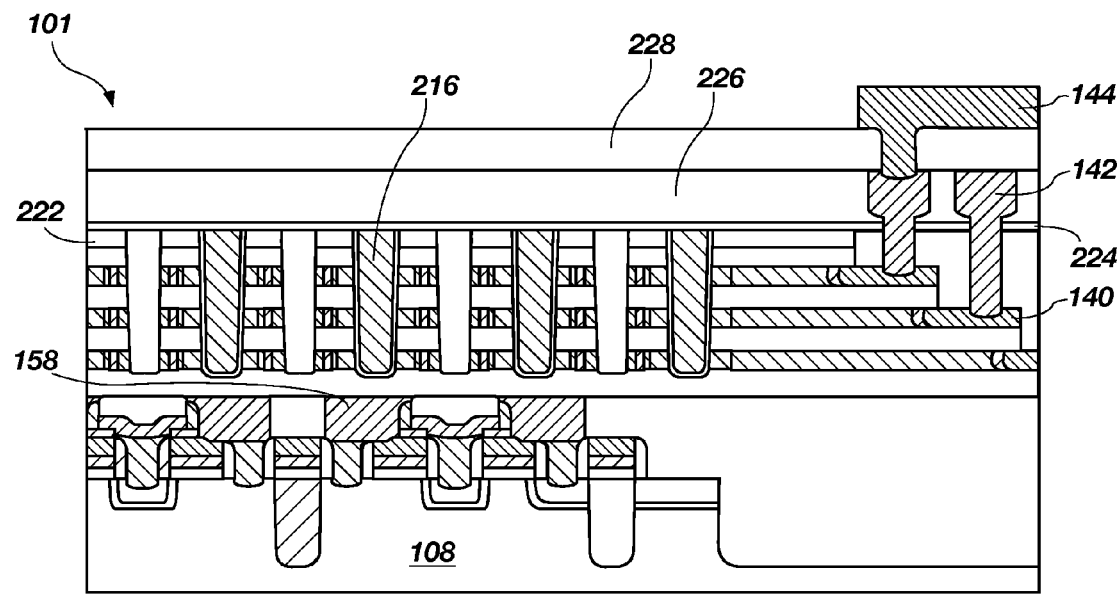

As shown in FIGS. 29A and 29B, the metal lines 144 may be formed over and in contact with the line interconnects 142. FIG. 29B is a cross-sectional view of the semiconductor structure 101 shown in FIG. 29A taken along section line 29-29 therein. The sacrificial plugs 216 and the cell plugs 158 are shown in broken lines in FIG. 29A for the purposes of illustrating the underlying structure. To form the metal lines 144, an upper dielectric material 228 may be formed over a surface of the intermediate dielectric material 226 and exposed surfaces of the line interconnects 142. The metal lines 144, each electrically coupled to one of the line interconnects 142 may be formed using conventional lithographic processes. For example, a photoresist (not shown) may be formed over the upper dielectric material 228 and apertures (not shown) may be formed therein, each aperture overlying one of the line interconnects 142. A portion of the upper dielectric material 228 may be removed through the apertures to form openings, each exposing a surface of the underlying line interconnect 142. The openings may be filled with metal using a conventional chemical vapor deposition (CVD) process and may be etched back using a conventional chemical mechanical polishing (CMP) process to form the metal lines 144.

Figure 30A:
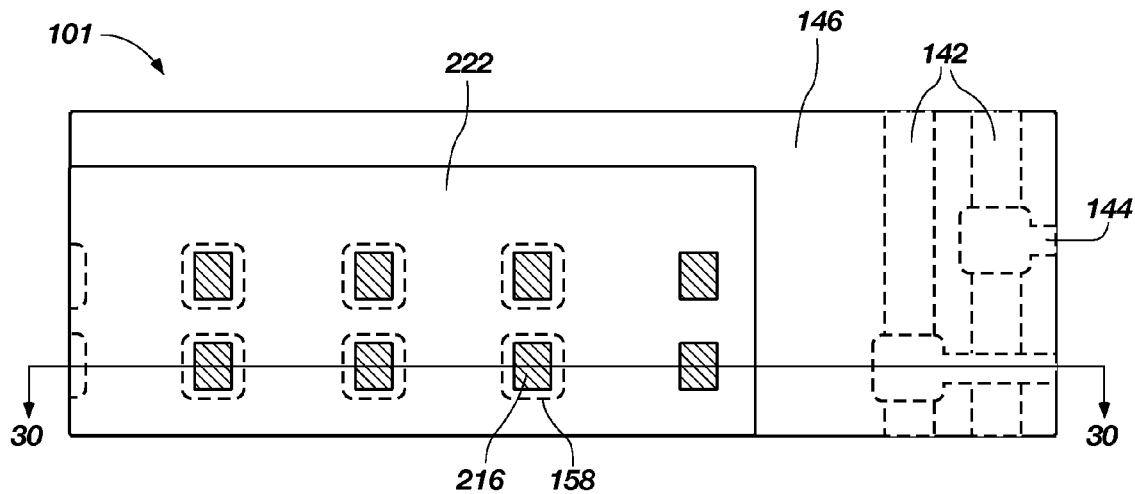
Figure 30B:
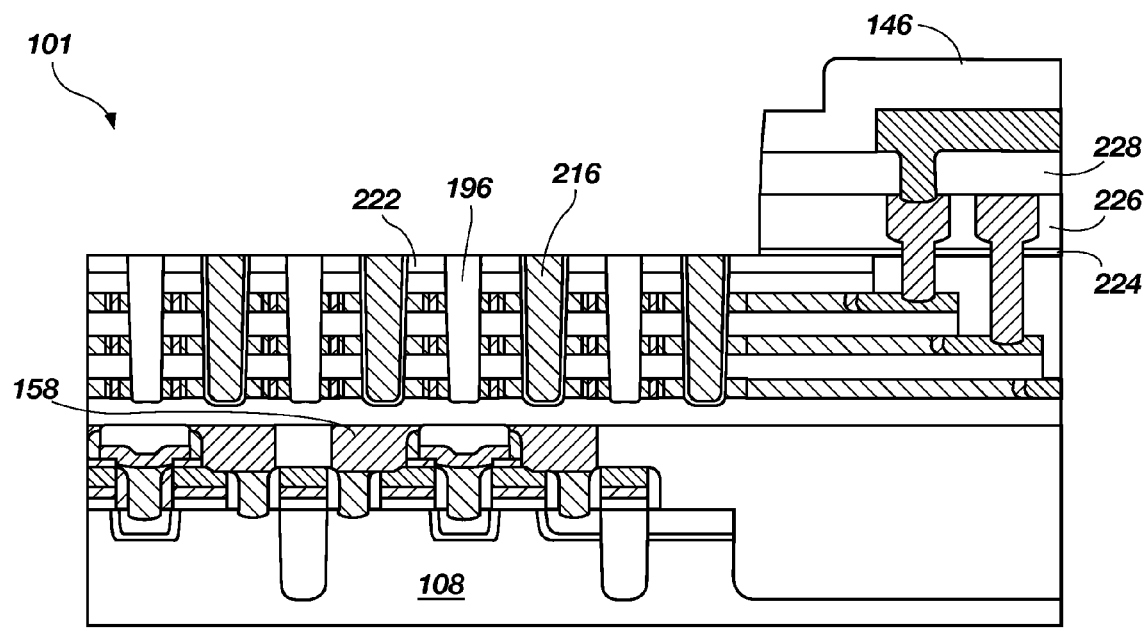

The passivation material 146 may, optionally, be formed over the semiconductor structure 101 and portions of the passivation material 146, the upper dielectric material 228, the intermediate dielectric material 226, and the third liner 224 may be removed, as shown in FIGS. 30A and 30B. FIG. 30B is a cross-sectional view of the semiconductor structure 101 shown in FIG. 30A taken along section line 30-30 therein. The cell plugs 158 are shown in broken lines in FIG. 30A for the purposes of illustrating the underlying structure. The passivation material 146 may be formed and patterned to cover the peripheral region 181 of the semiconductor structure 101 using conventional lithographic processes. Portions of the passivation material 146, the upper dielectric material 228, the intermediate dielectric material 226 and the third liner 224 may be removed with respect to the passivation material 146 and the third liner 224 using a conventional anisotropic reactive ion (i.e., plasma) etching process. Portions of the third liner 224 exposed through the passivation material 146 may then be removed to expose surfaces of the fill material 196, the lower dielectric material 222 and the sacrificial plugs 216.

Figure 31A:
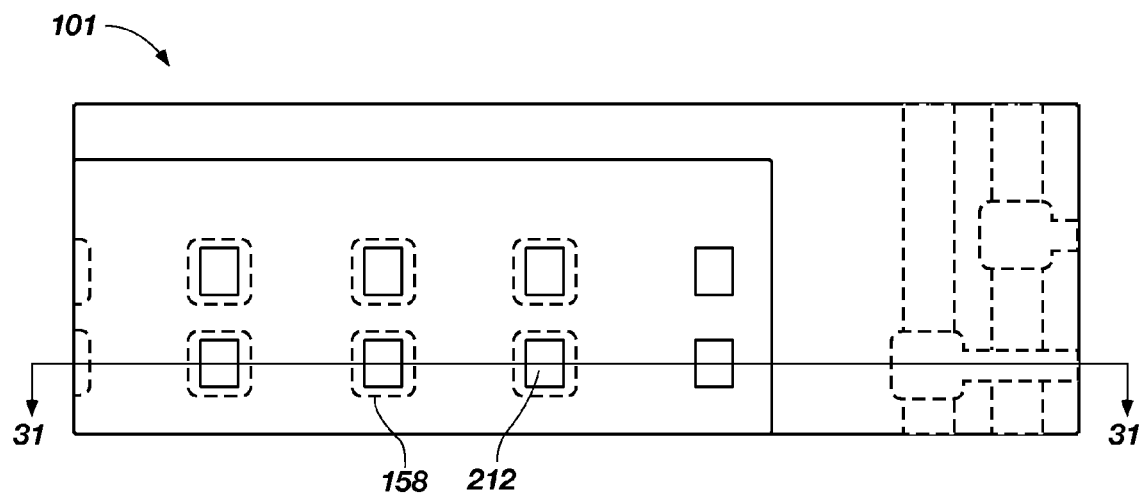
Figure 31B:
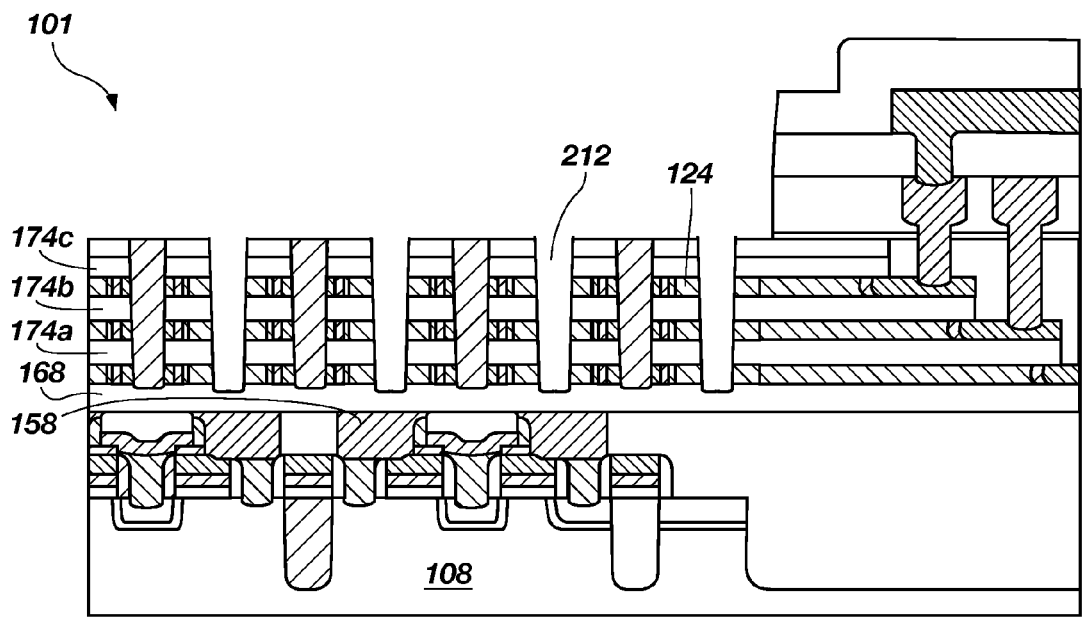

Referring to FIGS. 31A and 31B, the sacrificial plugs 216 and the second liner 214 may be removed from the semiconductor structure 101 to expose sidewalls of the second slots 212. FIG. 31B is a cross-sectional view of the semiconductor structure 101 shown in FIG. 31A taken along section line 31-31 therein. The cell plugs 158 are shown in broken lines in FIG. 30A for the purposes of illustrating the underlying structure. As a non-limiting example, the sacrificial plugs 216 may be removed selective to the second liner 214 using an anisotropic etching process (e.g., a dry reactive ion or plasma etching process). As a non-limiting example, if the sacrificial plugs 216 are polysilicon and the second liner 214 is a nitride material, a tetramethylammonium hydroxide (TMAH) etchant may be introduced to the semiconductor structure 101 to selectively remove the polysilicon without removing the nitride material. The second liner 214 may then be removed using a conventional anisotropic etching process (e.g., a dry reactive ion or plasma etching process) to expose portions of the second doped regions 124, the second regions 174a, 174b and 174c and the foundation material 168 defining the second slots 212.

Figure 32A:
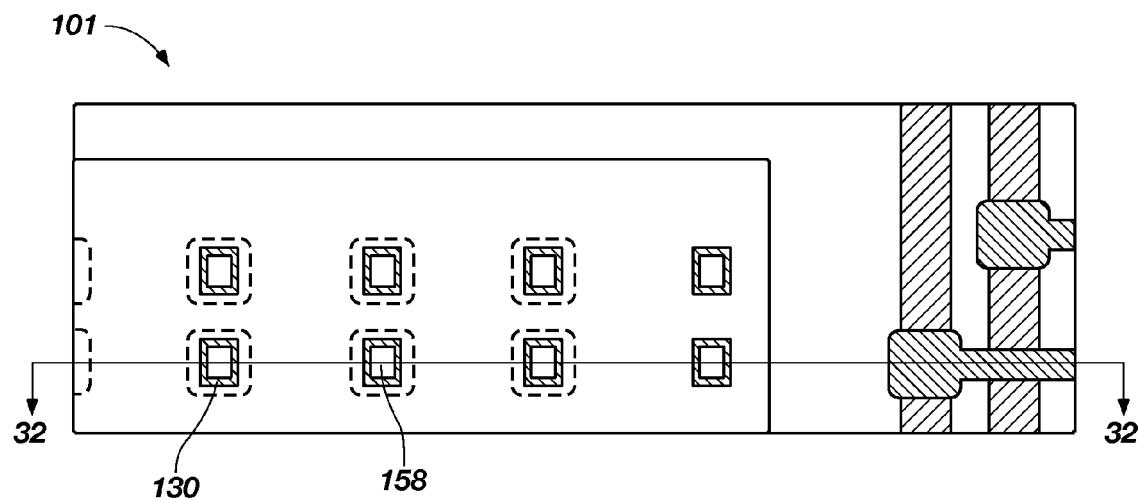
Figure 32B:
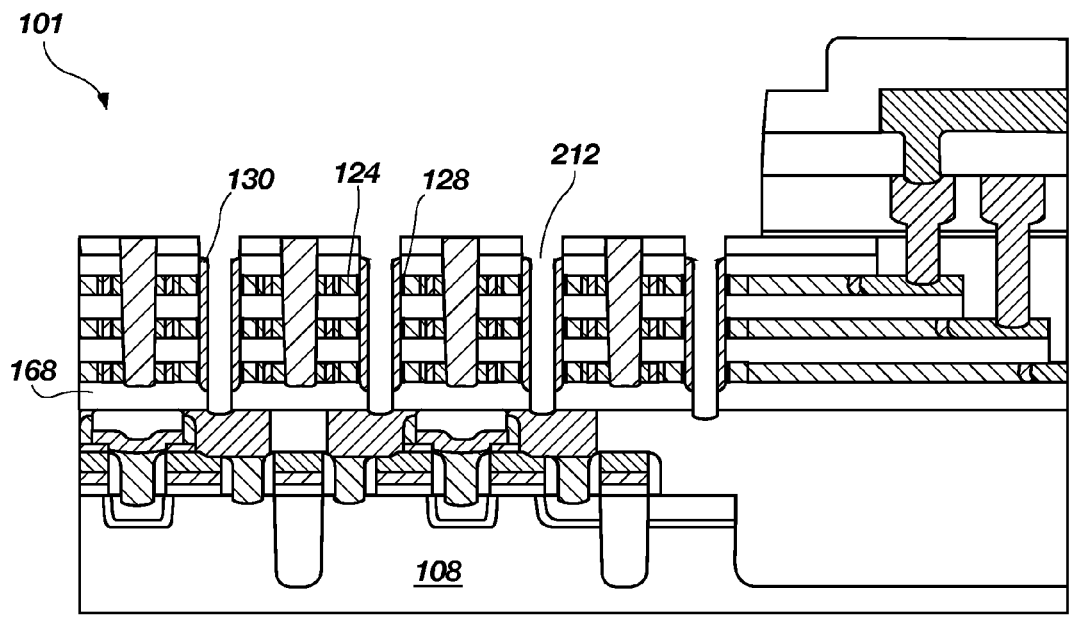

FIGS. 32A and 32B show the semiconductor structure 101 after formation of the barrier material 128 and the sidewall spacers 130. FIG. 32B is a cross-sectional view of the semiconductor shown in FIG. 32A taken along section line 32-32, which bisects the cell plugs 158. As a non-limiting example, the barrier material 128 may include a dielectric such as an oxide material or a nitride material. The barrier material 128 may be formed over the exposed portions of the second doped region 124 using a conventional chemical vapor deposition (CVD) process or oxidation process. The sidewall spacers 130 may be formed from, for example, a metal or a ceramic material, such as titanium nitride (TiN), titanium (Ti) or platinum (Pt). The sidewall spacers 130 may be formed over the sidewalls of the second slots 212 using a conventional chemical vapor deposition (CVD) process. The sidewalls spacers 130 may include a material that substantially reduces diffusion of metals into the second doped regions 124. After forming the sidewall spacers 130, an etching process (e.g., an anisotropic dry reactive ion or plasma etching process) may be used to etch through the foundation material 168 exposing underlying portions of the cell plugs 158. A conductive material such as, for example, tungsten, may be deposited to fill remaining portions of the second slots using a conventional chemical vapor deposition (CVD) process and etched back to form the electrodes 110, each of which is electrically coupled to one of the cell plugs 158 as shown in FIGS. 1A and 1B. Two memory strings 102 may be electrically coupled to each of the nodes at intersecting points of the bit lines 162 and the column lines 160. As shown in FIG. 1A, each of the electrodes 110 effectively forms a dual-node having diodes 104 on opposite sides thereof.

Figure 33A:
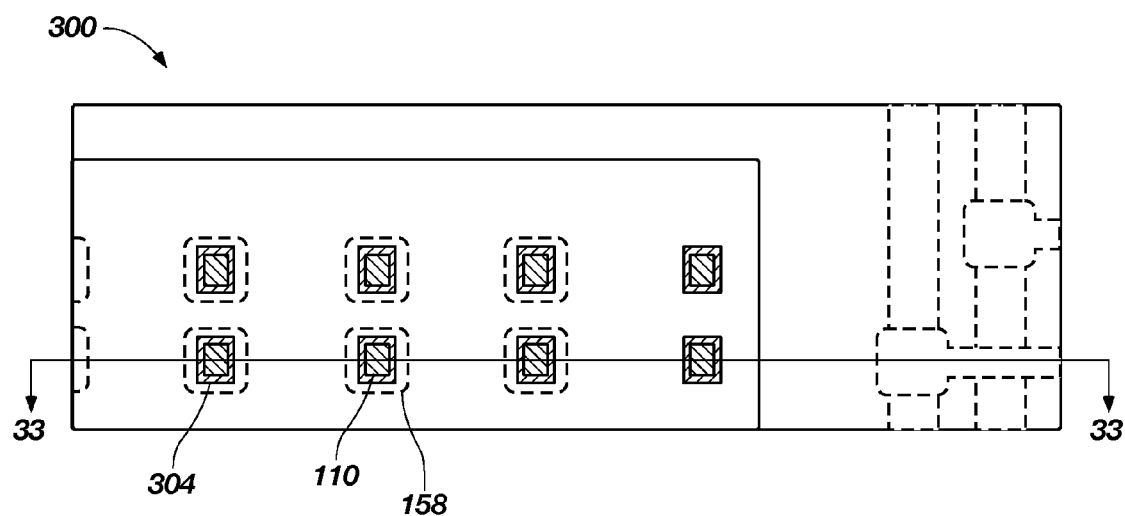
FIG. 33A is a top down view illustrating another embodiment of a memory device of the present invention.
Figure 33B:
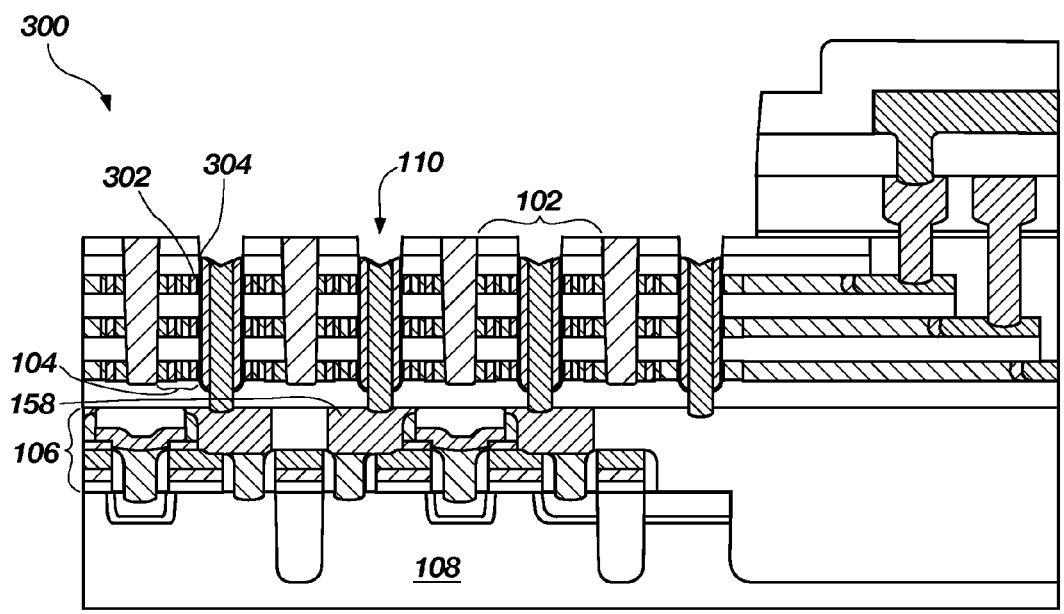
FIG. 33B is a partial cross-sectional view of the memory device shown in FIG. 33A taken along section line 33-33.

Another embodiment of a memory device 300 is shown in FIGS. 33A and 33B. The memory device 300 may be, for example, a resistive random access memory (RRAM) device that includes another silicide region 302 and a memory element 304 disposed between the electrode 110 and the diodes 104 of each memory string 102. An embodiment of a method that may be used to form the memory device 300 is described below with reference to FIGS. 34-36.

Figure 34:
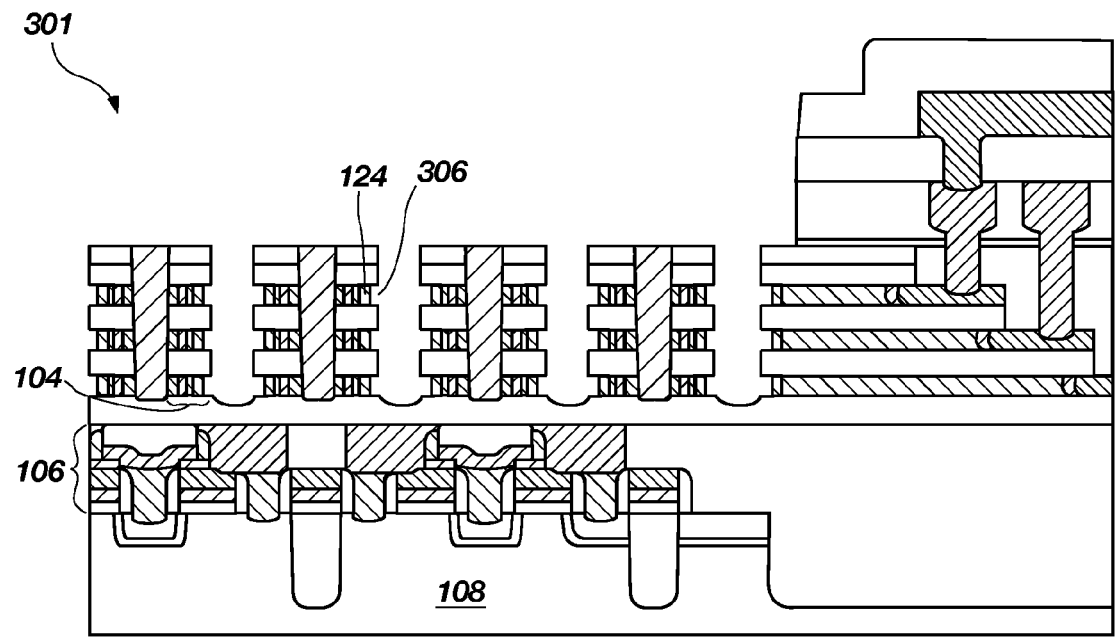
FIGS. 34-36 are partial cross-sectional views of a semiconductor structure and illustrate an embodiment of a method of the present invention used to form the memory device shown in FIGS. 33A and 33B.

As shown in FIG. 34, a semiconductor structure 301 including a plurality of vertically superimposed diodes 104 overlying a conventional MOSFET array 106 disposed on a substrate 108 may be formed in the manner previously described with reference to FIGS. 4A-31B. A conventional anisotropic reactive ion etching process may be performed to remove an exposed portion of each of the second doped regions 124 forming a plurality of recesses 306 therein.

Figure 35:
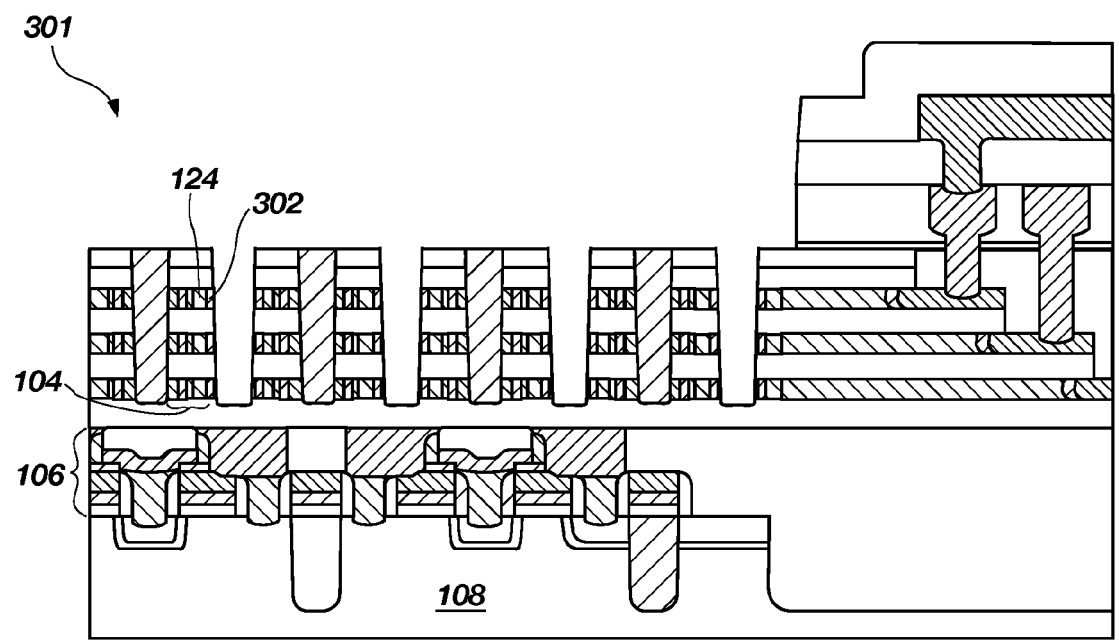

Referring to FIG. 35, the another silicide region 302 may be deposited in the recesses 306 (FIG. 34) in each of the second doped regions 124. As a non-limiting example, the another silicide region 302 may include cobalt silicide ($CoSi_2$), titanium silicide ($TiSi_2$), tungsten silicide ($TiSi_2$) or nickel silicide ($NiSi_2$) and may be deposited using a conventional chemical vapor deposition (CVD) process.

Figure 36:
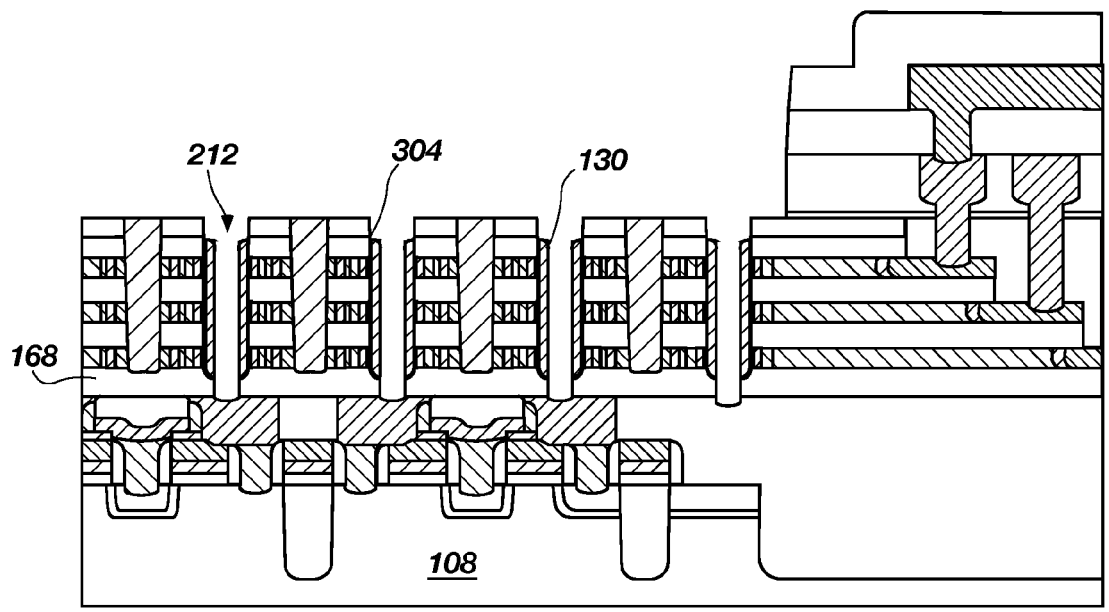

As shown in FIG. 36, the memory element 304 and the sidewall spacer 130 may be formed over each of the sidewalls of the second slots 212. The memory element 304 may include a dielectric material such as, for example, and oxide material or a nitride material. The memory element 304 may be formed using, for example, a conventional chemical vapor deposition (CVD) process. The sidewall spacer 130 may include titanium oxide ($TiO_2$), copper oxide ($Cu_xO_y$), tungsten oxide ($W_xO_y$), nickel oxide ($Ni_xO_y$) or gallium oxide ($Ga_2O_3$) and may be formed using methods such as those described with respect to FIGS. 32A and 32B. After forming the memory element 304 and the sidewall spacer 130 over each of the sidewalls, an exposed region of the foundation material 168 may be removed using an etchant that selectively etches away the foundation material 168 selective to the memory element 304 and the sidewall spacer 130. For example, the foundation material 168 may be removed using a conventional anisotropic dry reactive ion or plasma etching process to expose a portion of each of the underlying cell plugs 158. Contact plugs 132 that include, for example, tungsten, may then formed in remaining portions of the second slots 212 over the sidewall spacers 130 using a conventional chemical vapor deposition (CVD) process to form the memory device 300 shown in FIGS. 33A and 33B.

Figure 37A:
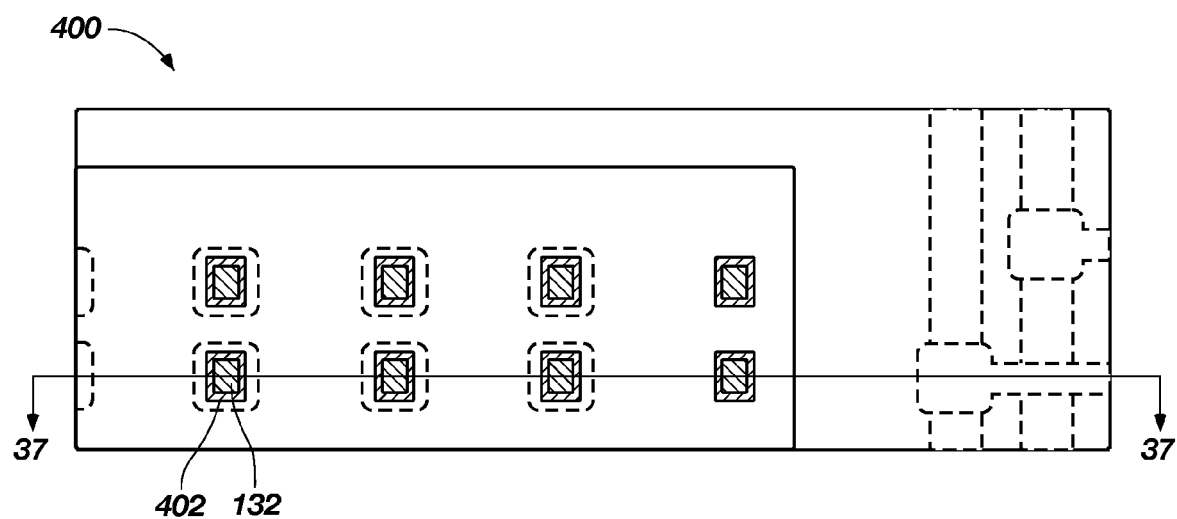
FIG. 37A is a top down view illustrating yet another embodiment of a memory device of the present invention.
Figure 37B:
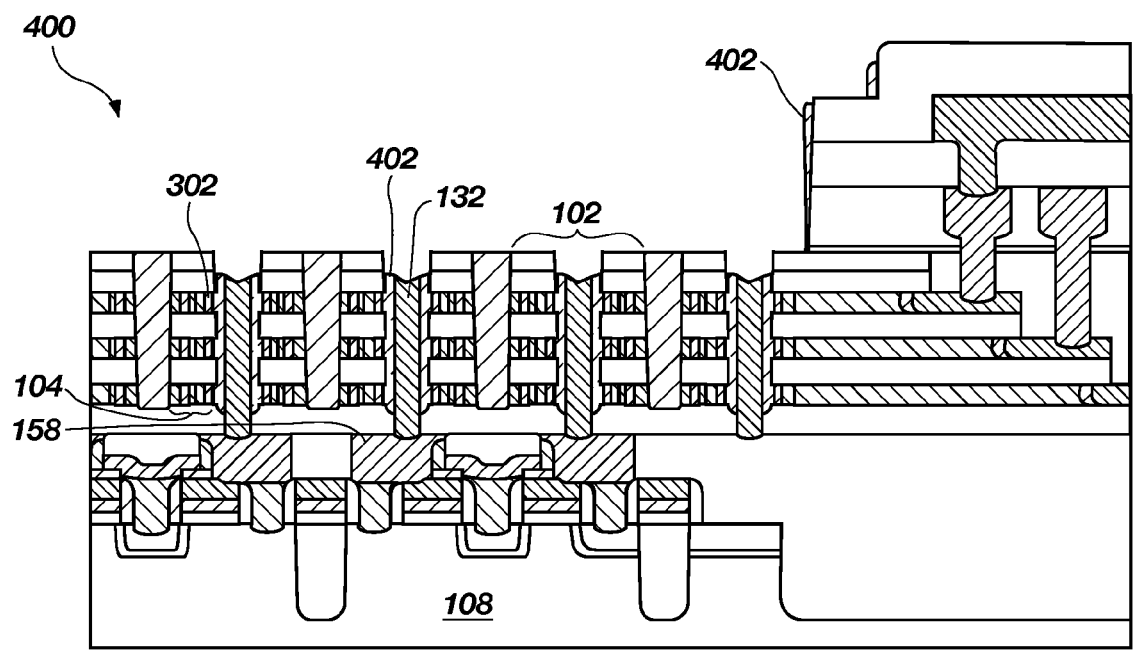
FIG. 37B is a partial cross-sectional view of the memory device shown in FIG. 37A taken along section line 37-37.

Another embodiment of a memory device 400 is shown in FIGS. 37A and 37B. FIG. 37B is a cross-sectional view of the memory device 400 shown in FIG. 37A taken along section line 37-37 therein. The memory device 400 may be, for example, a phase-change random access memory (PCRAM) device that includes the another silicide 302 and a phase change material 402 disposed between the diodes 104 and the contact plugs 132 of the at least one memory string 102. An embodiment of a method that may be used to form the memory device 400 is described below with reference to FIGS. 38 and 39.

Figure 38:
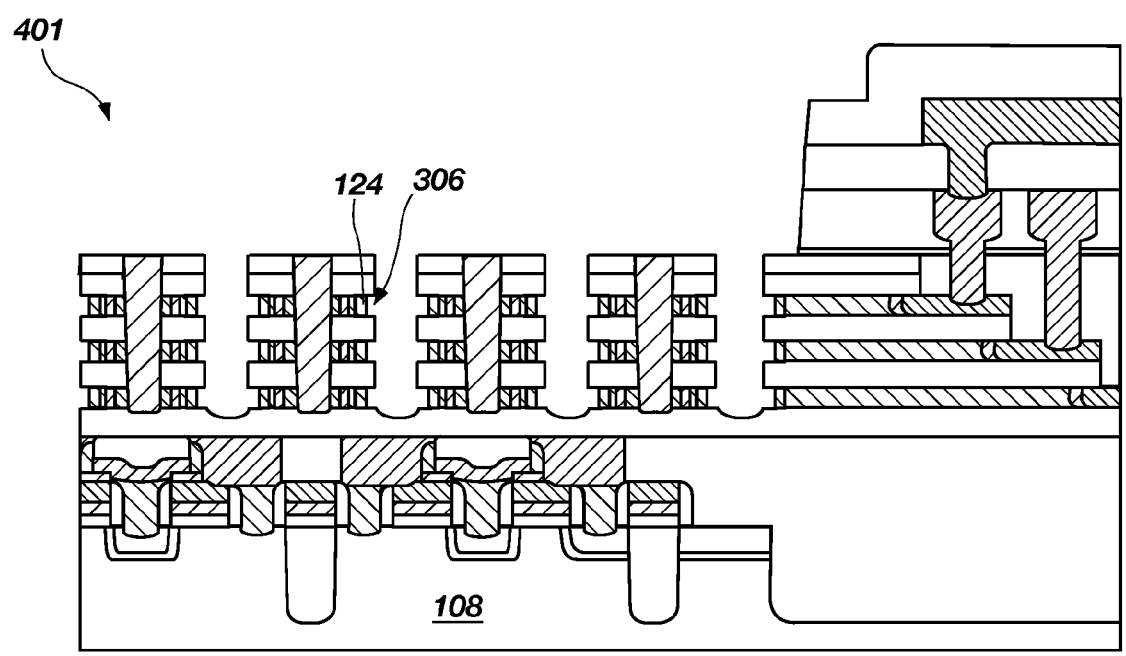
FIGS. 38 and 39 are partial cross-sectional views of a semiconductor structure and illustrate an embodiment of a method of the present invention used to form the memory device shown in FIGS. 37A and 37B.

As shown in FIG. 38, a semiconductor structure 401 may be formed in the manner previously described with reference to FIGS. 4A-31B and a conventional anisotropic reactive ion etching process may be performed to form the recesses 306 in the second doped regions 124.

Figure 39:
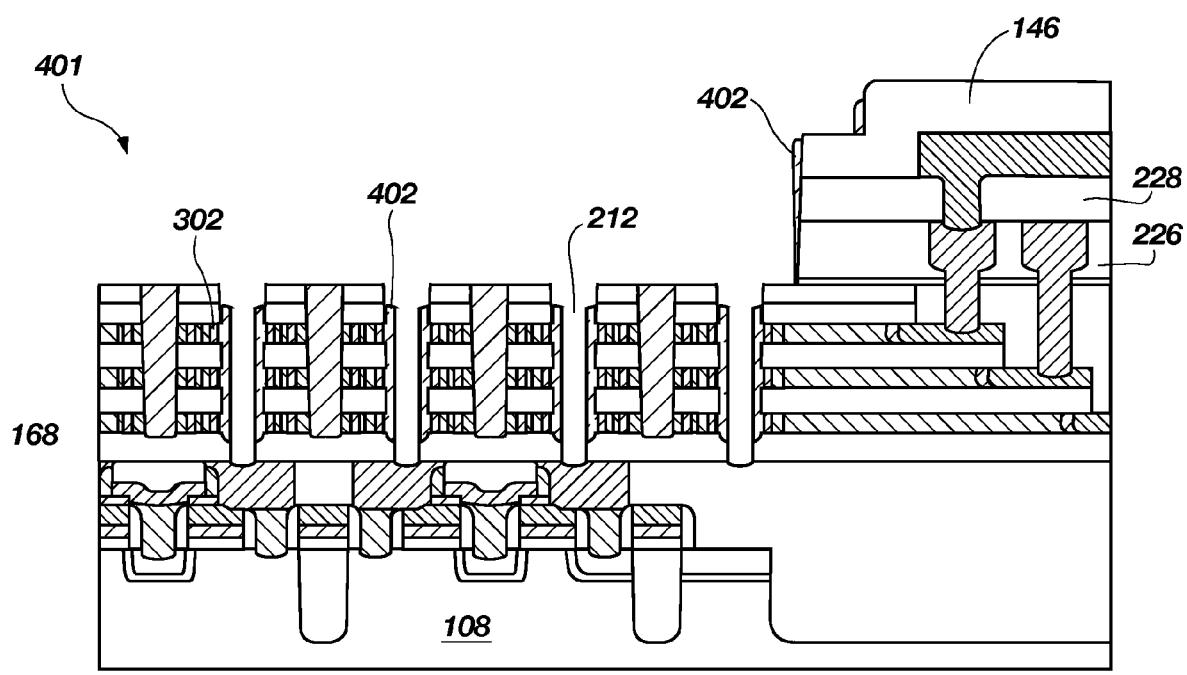

Referring to FIG. 39, a phase change material 402 may be formed over the sidewalls exposed within each of the second slots 212. The phase change material 402 may also be deposited on sidewalls of the passivation material 146, the upper dielectric material 228 and the intermediate dielectric material 226. As a non-limiting example, the phase change material 402 may include a chalcogenide such as $Ge_2Sb_2Te_5$ (GST). The phase change material 402 may be deposited using, for example, a conventional sputtering process. After forming the phase change material 402 over each of the sidewalls, an exposed region of the foundation material 168 may be removed using an etchant that etches away the foundation material 168 selective to the phase change material 402. For example, the foundation material 168 may be removed using a conventional anisotropic dry reactive ion or plasma etching process to expose a portion of each of the underlying cell plugs 158.

Contact plugs 132 may then be formed in remaining portions of the second slots 212 to form the memory device 400 as shown in FIGS. 37A and 37B. As a non-limiting example, the contact plugs 132 may include a conductive material such as, for example, tungsten. The contact plugs 132 may be formed by depositing the conductive material using a conventional chemical vapor deposition (CVD) process and then etching the conductive material back.

Although the vertically superimposed diodes 104 are shown herein as part of vertical non-volatile memory devices, they may also be utilized in various other memory applications as will be recognized by one of ordinary skill in the art. The memory strings 102 each include two diodes 104 per cell and, thus, provide a higher density arrangement of diodes 104 that may be easily integrated with existing devices. By using a conventional MOSFET device as an address selector, memory devices including the vertically superimposed diodes 104 provide a substantially increased $I_{off}$. The methods of forming the vertically superimposed diodes 104 as described above enable formation of temperature-sensitive elements, such as, phase change materials, as a final act after completion of processes requiring increased temperatures. The arrangement of diodes 104 described herein provides increased memory density at a reduced cost.

In view of the above description, some embodiments of the present invention include a non-volatile memory device that includes an electrode and at least one memory string disposed over a substrate and including a plurality of diodes arranged at different locations along a length of the electrode. The electrode may include, for example, a metal contact plug having at least one of a metal or a ceramic material disposed on opposite sides or, alternatively, a phase change material. Each of the plurality of diodes may include an intrinsic region disposed between a p-type doped region and an n-type doped region. The p-type doped region, the n-type region, and the intrinsic region may extend along a length of the substrate substantially perpendicular to the length of the electrode. The at least one memory string is disposed on a memory device comprising a plurality of memory cells and may be electrically coupled thereto by the electrode.

Additional embodiments of the present invention include an intermediate semiconductor structure that includes a plurality of diodes overlying a substrate and vertically superimposed over one another in a plurality of columns, each of the plurality of diodes being spaced apart from one another by a dielectric material. The plurality of diodes may be disposed on a plurality of memory cells, each of which is electrically coupled to a cell plug. At least one of the plurality of columns may at least partially overlie a portion of the cell plug.

Further embodiments include methods of fabricating a semiconductor structure. A plurality of alternating first regions and second regions may be deposited over a foundation material overlying a transistor array to form a cell stack, the transistor array comprising a plurality of transistors, each of which is electrically coupled to a cell plug. Portions of the cell stack exposed through a mask may be removed to form a plurality of first slots, each of which at least partially overlies the cell plug. A dopant may be introduced to exposed portions of the first regions to form a plurality of p-type doped regions and a silicide material may be deposited over each of the plurality of p-type doped regions. A fill material may be deposited over the semiconductor structure to at least fill the plurality of first slots. Portions of the cell stack exposed through another mask may form a plurality of second slots laterally spaced apart from each of the plurality of first slots. Exposed portions of the first regions may be introduced to a dopant to form a plurality of n-type doped regions, an intrinsic region disposed between the plurality of n-type doped regions and the plurality of p-type doped regions.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the scope of the invention as defined by the claims that follow, and their legal equivalents.

What is claimed is:

1. A non-volatile memory device, comprising:
   memory strings overlying transistors, each of the memory strings comprising diodes;
   an electrode electrically coupled to the diodes of each of the memory strings and to at least one transistor, the diodes arranged at locations spaced along a length of the electrode; and
   a dielectric material between and electrically isolating each of the memory strings from an adjacent memory string.

2. The non-volatile memory device of claim 1, wherein each of the diodes comprises an intrinsic region between a first doped region and a second doped region, and wherein the first doped region and the second doped region are oppositely doped.

3. The non-volatile memory device of claim 1, wherein the diodes of each memory string are laterally adjacent the electrode.

4. The non-volatile memory device of claim 1, wherein each diode of each memory string is separated from a laterally adjacent diode of the memory string by the electrode.

5. The non-volatile memory device of claim 1, wherein a portion of the diodes of each memory string is laterally adjacent a surface of the electrode and a remaining portion of the diodes of each memory string is laterally adjacent an opposing surface of the electrode.

6. The non-volatile memory device of claim 1, wherein the diodes are vertically superimposed in a direction substantially perpendicular to a major plane of the non-volatile memory device.

7. The non-volatile memory device of claim 2, wherein each of the diodes further comprises a silicide region adjacent to the first doped region.

8. The non-volatile memory device of claim 2, wherein the intrinsic region comprises at least one semiconductor material selected from the group consisting of polysilicon, germanium, gallium arsenide, and silicon germanium.

9. The non-volatile memory device of claim 7, further comprising another silicide region and a memory element between the electrode and each of the diodes.

10. The non-volatile memory device of claim 9, wherein the another silicide region comprises a material selected from the group consisting of cobalt silicide, titanium silicide, tungsten silicide and nickel silicide.

11. The non-volatile memory device of claim 9, wherein the memory element comprises an oxide material or a nitride material.

12. The non-volatile memory device of claim 7, further comprising another silicide region and a phase change material between each of the diodes and the electrode.

13. The non-volatile memory device of claim 12, wherein the phase change material comprises germanium-antimony-tellurium.

14. A semiconductor structure comprising:
    diodes overlying a substrate and vertically superimposed over one another to form columns of diodes, each of the diodes comprising an intrinsic region between oppositely doped regions; and
    a dielectric material between at least two adjacent columns of diodes to isolate the diodes of the at least two adjacent columns of diodes from one another.

15. The semiconductor structure of claim 14, further comprising transistors on the substrate, each of the transistors electrically coupled to a word line and a bit line.

16. The semiconductor structure of claim 14, further comprising data access lines electrically coupled to the diodes.

17. The semiconductor structure of claim 14, wherein the diodes of each column of diodes are separated from adjacent diodes in the column of diodes by an interlayer dielectric material.

18. A method of forming a semiconductor structure, comprising:
    removing portions of a cell stack to form first slots through the cell stack, the cell stack comprising first regions and second regions;
    introducing a dopant to exposed portions of the first regions to form first doped regions;
    converting a segment of each of the first doped regions to a silicide material;
    forming a fill material over the cell stack to at least fill the first slots;
    removing portions of the cell stack to form second slots laterally spaced apart from each of the first slots; and
    introducing a dopant to exposed portions of the first regions to form second doped regions, an intrinsic region of the first region disposed between one of the second doped regions and one of the first doped regions.

19. The method of claim 18, wherein removing portions of a cell stack to form first slots through the cell stack comprises removing alternating portions of the first regions and the second regions exposed through a mask material on the cell stack.

20. The method of claim 18, wherein converting the segment of each of the first doped regions to the silicide material comprises:
    removing a portion of each of the first doped regions to form undercut regions therein; and
    forming and annealing a non-transition metal in each of the undercut regions.

21. The method of claim 18, wherein converting the segment of each of the first doped regions to the silicide material comprises forming a non-transition metal over each of the first doped regions and heating the first doped regions to react the non-transition metal with the first doped regions.

22. The method of claim 18, wherein forming the fill material over the cell stack to at least fill the first slots comprises forming an oxide material over the cell stack.

23. The method of claim 20, wherein removing a portion of each of the first doped regions comprises etching under each of the first doped regions with a mixture of chloropentane and sulfur hexafluoride.

24. The method of claim 21, wherein forming the non-transition metal over each of the first doped regions comprises forming at least one non-transition metal selected from the group consisting of cobalt, titanium, tungsten, and nickel over each of the first doped regions.

25. The method of claim 22, wherein forming a fill material over the cell stack to at least fill the first slots comprises forming dielectric studs in the first slots.

* * * * *

UNITED STATES PATENT AND TRADEMARK OFFICE
CERTIFICATE OF CORRECTION

PATENT NO. : 9,337,237 B2
APPLICATION NO. : 13/897615
DATED : May 10, 2016
INVENTOR(S) : Sanh D. Tang et al.

Page 1 of 1

It is certified that error appears in the above-identified patent and that said Letters Patent is hereby corrected as shown below:

In the specification:
COLUMN 5,    LINE 28,    change "No. RE 39,484" to --No. RE39,484--
COLUMN 6,    LINE 54,    change "may be aimed on" to --may be formed on--
COLUMN 17,   LINE 56,    change "increased $I_{off}$." to --increased $I_{off}$.--

Signed and Sealed this
Twelfth Day of July, 2016

Michelle K. Lee
*Director of the United States Patent and Trademark Office*